United States Patent
Boutami et al.

(10) Patent No.: US 11,592,601 B2
(45) Date of Patent: Feb. 28, 2023

(54) DIFFUSIVE STRUCTURE FOR LIGHT SOURCE

(71) Applicant: COMMISSARIAT A L'ENERGIE ATOMIQUE ET AUX ENERGIES ALTERNATIVES, Paris (FR)

(72) Inventors: Salim Boutami, Grenoble (FR); Bernard Aventurier, Grenoble (FR); Stéphane Getin, Grenoble (FR); Aurélien Suhm, Grenoble (FR); Pierre Joly, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 265 days.

(21) Appl. No.: 17/032,280

(22) Filed: Sep. 25, 2020

(65) Prior Publication Data

US 2021/0149091 A1    May 20, 2021

(30) Foreign Application Priority Data

Sep. 27, 2019 (FR) ..................... 19 10726

(51) Int. Cl.
*G02B 13/20* (2006.01)
*G02B 5/02* (2006.01)
(Continued)

(52) U.S. Cl.
CPC ......... *G02B 5/0221* (2013.01); *G02B 3/0012* (2013.01); *G02B 3/0056* (2013.01);
(Continued)

(58) Field of Classification Search
CPC .. G02B 5/0221; G02B 3/0012; G02B 3/0056; G02B 5/0268; H01L 33/58; H01L 2933/0058
(Continued)

(56) References Cited

U.S. PATENT DOCUMENTS

2006/0023127 A1* 2/2006 Peeters ................ G02B 5/0284
349/1
2011/0170184 A1 7/2011 Wolk
(Continued)

FOREIGN PATENT DOCUMENTS

FR    2 979 154 A1    2/2013

OTHER PUBLICATIONS

French Preliminary Search Report dated Jun. 26, 2020 in French Application 19 10726 filed Sep. 27, 2019 (with English Translation of Categories of Cited Documents and Written Opinion), 12 pages.
(Continued)

*Primary Examiner* — William Choi
(74) *Attorney, Agent, or Firm* — Oblon, McClelland, Maier & Neustadt, L.L.P.

(57) ABSTRACT

The invention relates to a diffuser 3 intended to be facing a light source 1 comprising a transmission layer 10 and a diffusion layer 22, 23 intended to diffuse a light transmitted by the light source, the diffuser being characterised in that the diffusion layer comprises a plurality of metal structures 200, 200a, 200b, called metal nanostructures, having dimensions less than a wavelength of the light transmitted, said metal nanostructures having varied sizes and being distributed within the diffusion layer such that adjacent metal nanostructures have between them, varied distances and preferably less than the wavelength of the light transmitted.

The invention also relates to a method for manufacturing such a diffuser, and a display system comprising such a diffuser.

21 Claims, 24 Drawing Sheets

(51) Int. Cl.
 *G02B 3/00* (2006.01)
 *H01L 33/58* (2010.01)
(52) U.S. Cl.
 CPC ............ *G02B 5/0268* (2013.01); *H01L 33/58* (2013.01); *H01L 2933/0058* (2013.01)
(58) Field of Classification Search
 USPC ........................................................ 359/707
 See application file for complete search history.

(56) References Cited

U.S. PATENT DOCUMENTS

2014/0218672 A1  8/2014  Rossini et al.
2015/0167921 A1  6/2015  Gollier et al.

OTHER PUBLICATIONS

Kawamoto, H., "The History of Liquid-Crystal Displays," Proceedings of the IEEE, vol. 90, No. 4, Apr. 2002, 41 pages.
Gray, G. W. et al., "Liquid Crystals for twisted nematic display devices," Journal of Materials Chemistry, 9(9), 1999, pp. 2037-2050 (with English Abstract only).
Waclawik, E. R. et al., "Liquid-Crystal Displays: fabrication and Measurement of a Twisted Nematic Liquid-Crystal Cell," Journal of Chemical Education, vol. 81, No. 6, Jun. 2004, 5 pages.

* cited by examiner

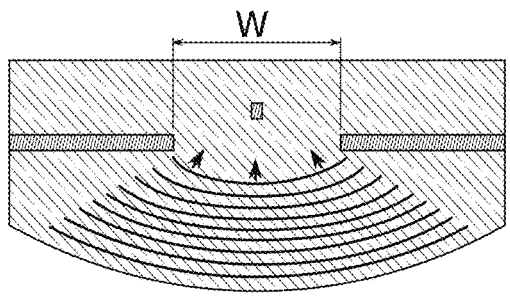 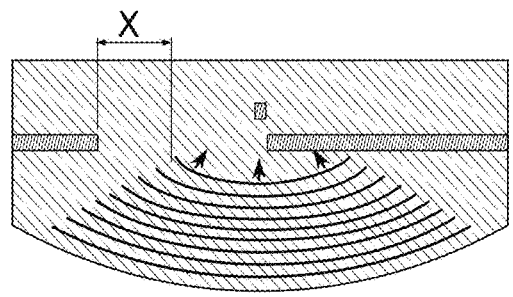
FIG. 16A   FIG. 16B
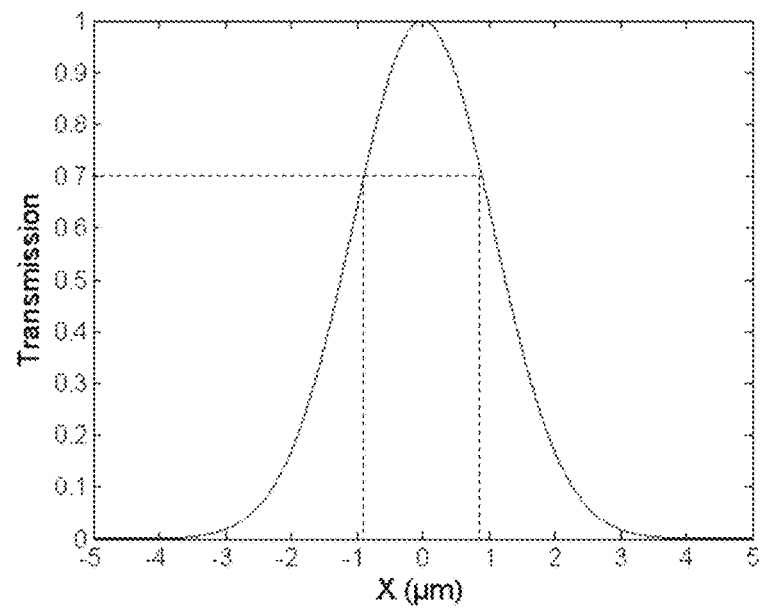
FIG. 16C
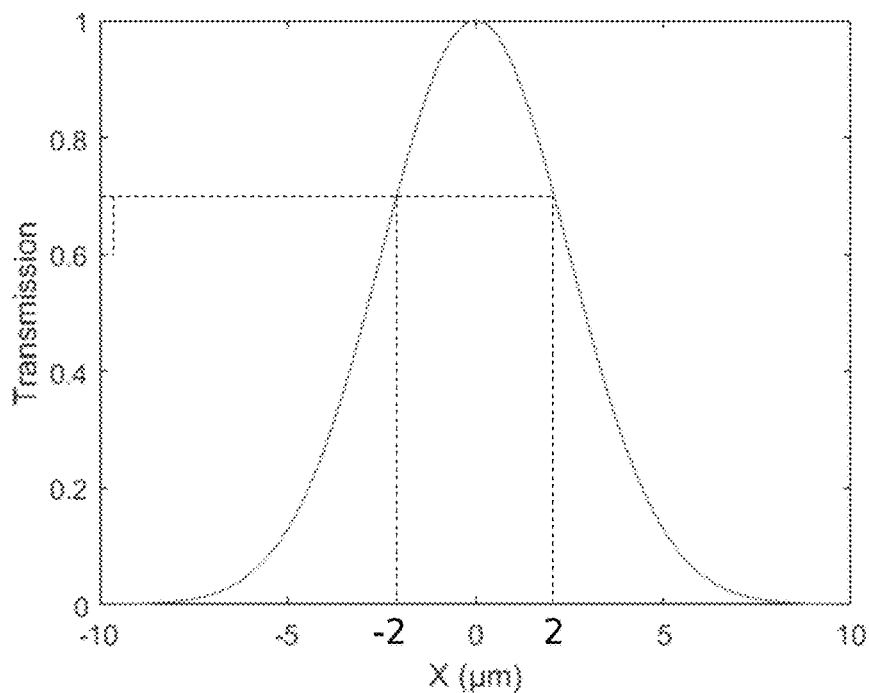
FIG. 16D

DIFFUSIVE STRUCTURE FOR LIGHT SOURCE

TECHNICAL FIELD

The invention relates to the field of optics. It has a particularly advantageous application in improving the diffusivity of pixelized light sources, such as light-emitting diodes (LEDs).

STATE OF THE ART

A light source can be extended or point source.

A point light source, also called pixelized light source, can be used in viewing or display systems. In particular, a plurality of adjacent point light sources allows to form pixels of a screen. Such a point light source can have dimensions of the order of a few tens of microns. Light-emitting diodes (LEDs) can advantageously form these point light sources.

An LED also has a relatively restricted beam angle. It is characterised by an increased directivity.

In certain applications however, it can be necessary to have a point light source having a low directivity, with a large beam angle. It is the case for 3D display screens, for example.

A solution to make a not very directive LED consists of adding a diffusive structure to the LED, so as to diffuse the light transmitted by the LED in all directions.

In a known manner, such a diffusive structure can be presented in the form of a dielectric diffusion film comprising random dielectric corrugations (FIG. 1A). The pseudo-periods and/or the dimensions of these corrugations can reach several microns, even several tens of microns (FIG. 1A). They are, in particular, larger than the transmission wavelength of the LED.

The operation of such a dielectric diffusion film is not therefore directly based on a phenomenon of diffusing light. The dielectric diffusion film generates, in this case, multiple refractions of light on surfaces of inclinations different from the corrugations, such as illustrated in FIG. 1B. The light is therefore refracted by the diffusion film, called refractive diffusion film, in a multitude of different directions.

This phenomenon of refracting light statistically in all directions reproduces, by averaging effect, an isotropic diffusion phenomenon. This type of refractive diffusion film operates very well for extended light sources.

However, for pixelized light sources, in particular for pixelized sources of which the dimensions are less than or equal to 15 µm, this type of refractive diffusion film does not allow to reproduce an isotropic diffusion phenomenon for each of the sources.

Such pixelized sources arranged facing this type of refractive diffusion film are no longer each associated with a multitude of corrugations.

The averaging effect obtained with an extended source is therefore no longer obtained with a point source. In this case, the light transmitted by a point source is refracted in a limited number of directions, even in one single direction. The diffusion phenomenon is therefore not well reproduced. This refraction is even partially anisotropic. The point source, for example an LED forming a pixel of a display screen, remains very directive with this type of refractive diffusion film.

In this case, the refraction direction(s) further vary(ies) from one pixel to another. For a screen of which the pixels are LEDs, all transmitting a light of same luminous intensity, luminous intensity variations due to the refraction diffusion film can therefore be perceived on the screen, along the observation direction, which is naturally highly undesirable.

The present invention aims to overcome at least partially some of the disadvantages mentioned above.

In particular, an aim of the present invention is to propose a diffusion film or diffuser allowing to optimise the diffusion of light transmitted by a light source, preferably by a point light source.

Another aim of the present invention is to propose a method for manufacturing such a diffuser.

Another aim of the present invention is to propose a system comprising at least one such diffuser and at least one pixelized light source, engaging with one another.

The other aims, features and advantages of the present invention will appear upon examining the following description and supporting drawings. It is understood that other advantages can be incorporated.

SUMMARY

To achieve the aims mentioned above, an aspect of the present invention relates to a diffuser intended to receive a light transmitted by a visible light source, said diffuser comprising a transmission layer, transparent to the light transmitted and a diffusion layer intended to diffuse the light transmitted by the light source, and preferably supported at least partially by the transmission layer.

Advantageously, the diffusion layer comprises a plurality of metal nanostructures, each having, in projection in a main extension plane, first and second dimensions along respectively first and second orthogonal directions of the main extension plane, said first and second dimensions being less than 650 nm.

These metal nanostructures are distributed within the diffusion layer, such that adjacent metal nanostructures between them have distances of varied separations. These metal nanostructures are further sized so as to have between them varied dimensions among the first and the second dimensions.

Thus, the diffuser according to the invention comprises a plurality of nanostructures each having at least two dimensions less than 650 nm, preferably less than 500 nm and preferably less than 400 nm. The first and second dimensions of the nanostructures are therefore less than at least one portion of the spectrum of wavelengths of the visible light. This allows to obtain a phenomenon of diffusing this light, contrary to the refractive diffuser presented above.

Furthermore, these first and second dimensions are taken along two orthogonal axes in the main extension plane. This allows to obtain this diffusion phenomenon along at least two orientations which, on average, cover as best as possible, an observation plane wherein an observer is located. The relative orthogonal arrangement corresponds to the best compromise as possible with two orientations. This allows to improve the isotropy of the diffusion.

These nanostructures are made of a metal material. Such a metal material has, in particular, a refraction index at least twice greater than that of the transmission layer transparent to the light transmitted. This allows to obtain a significant diffusion phenomenon, contrary to the refractive diffuser presented above. The effectiveness of the diffusion is improved.

The nanostructures preferably form a single layer of particles on the transmission layer. The light which passes through this single layer in normal or almost normal incidence is thus slightly attenuated. Almost all of the incident light can thus be effectively diffused.

Moreover, these nanostructures, in particular the adjacent nanostructures, between them have varied separation dimensions and distances. This allows to avoid a diffusion of the light along a favoured direction by network effect. This allows to improve the isotropy of the diffusion. The nanostructures are preferably oriented randomly or in a disorganised manner.

Thus, the present invention provides to integrate in the diffusion layer of the metal nanostructures allowing not only to diffuse the light, but to make such an effective and isotropic diffusion.

The developments made in the scope of the present invention have shown that the combination of the features of these nanostructures allowed to obtain a synergic effect, leading to an optimised diffusion, in particular for point or pixelized light sources.

An alternative solution, which differs from the solution retained in the scope of the present invention, but which would have been able to be implemented, consists of a diffuser comprising a transmission layer and a dielectric nanostructure-based diffusion layer, such as illustrated in FIG. 3A.

This alternative solution has not been retained in the scope of the present invention, as it has been identified that the dielectric nanostructures do not allow an effective diffusion of light. The performances of this alternative solution are detailed below through simulation results.

The development having led to the present invention have therefore shown that it is essential to provide a metal nanostructure-based diffusion layer.

Another aspect of the present invention relates to a diffuser intended to receive a light transmitted by a visible light source, said diffuser comprising a transmission layer, transparent to the light transmitted and a diffusion layer intended to diffuse said light transmitted, wherein the diffusion layer comprises at least one metal nanostructure having, in projection in a main extension plane, first and second dimensions respectively along first and second orthogonal directions of the main extension plane, less than 650 nm.

Advantageously, this diffuser further comprises a focalisation layer configured to focus the light transmitted on the at least one metal nanostructure. This allows to increase the angular diffusion diagram.

Advantageous results linked to the diffuser according to the different aspects of the invention are presented below.

The present invention also relates to a method for manufacturing a diffuser comprising at least one diffusion layer intended to diffuse a light transmitted by a visible light source and comprising a plurality of metal nanostructures.

This method comprises the following steps:
Providing a support made of a material transparent to the light transmitted and having a support face,
Forming, on the support face, a plurality of metal nanostructures, or at least one metal nanostructure, each having in projection in a main extension plane parallel to the support face of the first and second dimensions respectively along first and second orthogonal directions of the main extension plane, said first and second dimensions being less than 650 nm.

The metal nanostructures of the plurality of metal nanostructures are distributed on the support, such that adjacent metal nanostructures have between them, varied separation distances. These metal nanostructures are further sized so as to have between them, varied dimensions among the first and second dimensions.

The present invention also relates to a system comprising at least one diffuser according to the invention and a plurality of pixelized light sources, arranged to one another. The at least one diffuser is configured to cooperate with the at least one point light source so as to diffuse a light transmitted by it.

Such a system can advantageously be used to produce a display screen, in particular 3D screens.

BRIEF DESCRIPTION OF THE FIGURES

The aims, objectives, as well as the features and advantages of the invention will emerge better from the detailed description of embodiments of the latter which are illustrated by the following supporting drawings, wherein:

FIG. 16A schematically illustrates a diffuser comprising a transmission layer, a focalisation layer, a reflection layer and a metal nanostructure-based diffusion layer, according to an embodiment of the present invention having an ideal configuration and illuminated in an ideal manner.

FIG. 16B schematically illustrates a diffuser comprising a transmission layer, a focalisation layer, a reflection layer and a metal nanostructure-based diffusion layer, according to an embodiment of the present invention having a non-ideal configuration and illuminated in an ideal manner.

FIG. 16C shows an angular diagram obtained by simulation for a light transmission through the diffuser of FIG. 16B having a distance $d=3$ µm between the reflection layer and the diffusion layer and a distance $H=12$ µm between the reflection layer and the focalisation layer.

FIG. 16D shows an angular diagram obtained by simulation for a light transmission through the diffuser of FIG. 16B having a distance $d=7$ µm between the reflection layer and the diffusion layer and a distance $H=8$ µm between the reflection layer and the focalisation layer.

Figure 1A:
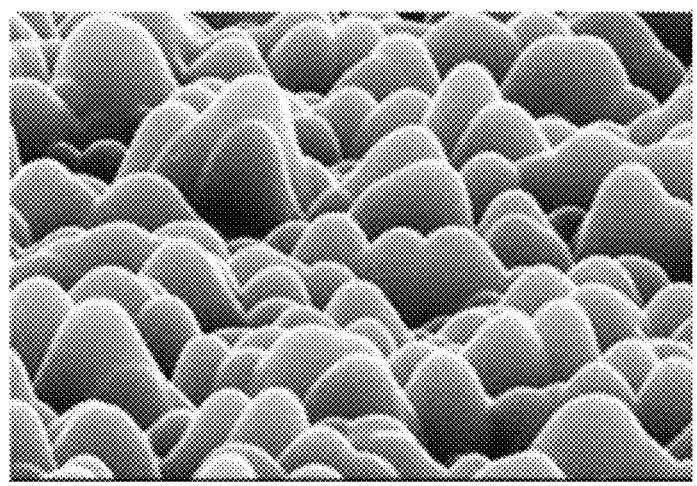
FIG. 1A is an image by scanning electron microscope of a dielectric diffusion film according to the prior art.
Figure 1B:
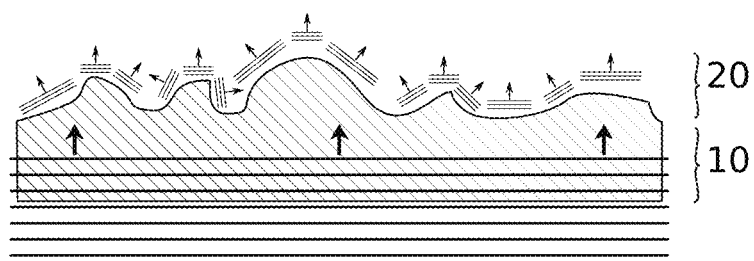
FIG. 1B schematically illustrates, as a cross-section, an operation of the dielectric diffusion film of FIG. 1A.

The drawings are given as examples and are not limiting of the invention. They constitute principle schematic representations intended to facilitate the understanding of the invention and are not necessarily to the scale of practical applications. In particular, the dimensions of the different layers and structures of the diffusers are not representative of reality. For reasons of clarity, one same set of references applicable to the figures of one same series is not necessarily applied to all the figures of the series. It is understood that, for the identification of the elements of a figure of a given series, the reader can refer to the other figures of this series. A series of figures typically comprise the figures bearing one same numerical reference associated with an alphabetical character.

DETAILED DESCRIPTION

Before starting a detailed review of embodiments of the invention, it is reminded that the invention comprises, in particular, the optional features below which could be used in association or alternatively. Except for incompatibility, it is understood that the diffuser according to the different aspects thereof, the manufacturing method, and the display system can comprise, mutatis mutandis, the following features:

According to an example, the adjacent metal nanostructures are separated from one another by different separation distances between them.

According to an example, at least some of the adjacent metal nanostructures have separation distances less than 500 nm, and at least some others of the adjacent metal nanostructures have separation distances greater than 600 nm.

According to an example, the separate distances between two adjacent metal nanostructures vary up to 200%, preferably up to 300% and preferably up to 500% within the diffusion layer.

According to an example, the separation distances between adjacent metal nanostructures are less than a wavelength of interest of the light transmitted.

According to an example, the first and second dimensions of the metal nanostructures are comprised between 100 nm and 500 nm.

According to an example, for one same nanostructure, the first and second dimensions of the metal nanostructures are substantially equal to one another.

According to an example, for at least some metal nanostructures of the plurality of metal nanostructures, the varied dimensions taken from among the first and the second dimensions are less than 250 nm, and for at least some other metal nanostructures of the plurality of nanostructures, the varied dimensions taken from among the first and the second dimensions are greater than 350 nm.

According to an example, the varied dimensions taken from among the first and the second dimensions vary up to 200%, preferably up to 300% and preferably up to 500% within the diffusion layer.

According to an example, within the diffusion layer, both the first dimensions and the second dimensions vary. Alternatively, within the diffusion layer, only the first dimensions or only the second dimensions vary.

According to an example, the first dimensions vary proportionally to the second dimensions.

According to an example, in projection in the main extension plane, the metal nanostructures each have a surface, and the surfaces of the metal nanostructures are not equal or at least are not all equal. The variation of the surfaces of the metal nanostructures within the diffusion layer can be such that $S_{max} \geq x*S_{min}$, with $S_{max}$ and $S_{min}$ being respectively the maximum and minimum surfaces within the diffusion layer, and $x=2$, preferably $x=3$ and preferably $x=5$.

According to an example, the diffuser further comprises a focalisation layer configured to focus the light transmitted on at least one metal nanostructure of the plurality of metal nanostructures. This focalisation layer is preferably situated on the transmission layer, on a side opposite the side of the transmission layer supporting the diffusion layer.

According to an example, the focalisation layer comprises one from among a refractive microlens and a Fresnel lens.

According to an example, the diffuser further comprises a reflection layer situated between the diffusion layer and the focalisation layer within the transmission layer, said reflection layer having at least one opening facing the metal nanostructure on which the light transmitted is focused. The reflection layer is preferably parallel to the diffusion layer.

According to an example, the opening has, in projection, in the main extension plane, a main extension dimension W such that: $W \geq (D \cdot d)/(H+d)$ where D is a main extension dimension of the diffuser, d is a distance separating the diffusion layer of the reflection layer, H is a distance separating the reflection layer from the focalisation layer.

According to an example, the diffuser has, in projection in the main extension plane, a main extension dimension D comprised between 5 μm and 30 μm.

According to an example, the metal nanostructures have a refraction index at least twice greater than that of the transmission layer.

According to an example, the diffusion layer has a thickness h comprised between 100 nm and 500 nm, the thickness h being taken along a direction perpendicular to said main extension plane.

According to an example, at least one portion of the metal nanostructures are made of at least one metal taken from among aluminium, tungsten, copper, silver, gold.

According to an example, the display system comprises:
- a screen, preferably a very high-resolution screen, comprising a plurality of micro-screens, each comprising a plurality of pixels,
- a plurality of projection systems associated with the plurality of micro-screens,
- a plurality of diffusers, each diffuser being associated with at least one pixel of the pluralities of pixels of the micro-screens, and
- a microlens array associated with the plurality of diffusers.

According to an example, the method further comprises a step of depositing on the plurality of metal nanostructures of a material transparent to the light transmitted and surrounding the metal nanostructures. According to an example, the method further comprises a step of planarizing the plurality of metal nanostructures, configured to form a composite diffusion layer comprising the material transparent to the light transmitted surrounding the metal nanostructures, such that said composite diffusion layer has a planarized face.

According to an example, the method further comprises the formation of a transmission layer on the planarized face, said transmission layer having a transmission face opposite the planarized face and intended to be facing the light source.

According to an example, the method further comprises the formation of a focalisation layer extending over the transmission face, said focalisation layer being intended to focus the light transmitted on at least one metal nanostructure of the plurality of metal nanostructures.

According to an example, the focalisation layer is formed by a refractive microlens, in particular a refractive microlens made of a material transparent to the light transmitted.

According to an example, the focalisation layer is formed by a Fresnel lens.

According to an example, the method further comprises the formation of a reflection layer within the transmission layer, between the diffusion layer and the focalisation layer, said reflection layer having at least one opening facing the at least one metal nanostructure on which the light transmitted is intended to be focused by the focalisation layer. The reflection layer is preferably parallel to the diffusion layer.

In the present patent application, reference is made of a main extension plane. This main extension plane is the plane xy of the coordinate system illustrated in the figures.

In the present patent application, thickness will preferably be referred to for a layer and height will preferably be referred to for a device. The thickness and the height are taken along a direction z normal to the main extension plane.

The term nanostructure means, in particular, a solid object of which at least one dimension is nanometric, i.e. strictly less than 1 µm. In the scope of the invention, the nanostructure(s) each has/have, in projection in the main extension plane, two nanometric dimensions, less than a few hundred nanometres, that is less than a wavelength of interest of the light transmitted.

By "size" of a nanostructure, this means:
- either the maximum distance between two points of the nanostructure taken in a plane parallel to the main extension plane, called critical dimension,
- or the surface of the projection of the nanostructure in the main extension plane,
- or the volume of this nanostructure.

The size of a nanostructure therefore corresponds to one or more dimensions representative of the nanostructure. The size of a spherical nanostructure can, for example, correspond to the diameter of the sphere.

By "separation distance" between two adjacent nanostructures, this means the smallest distance in projection in the main extension plane xy separating two adjacent nanostructures. The separation distances separating two adjacent nanostructures $200_i$ and $200_j$ are referenced $d_{ij}$, with i and j natural integers.

In the scope of the invention, the nanostructures have varied sizes and/or distances between them. This means that the sizes of these nanostructures and/or the distances between these nanostructures are not all equal. For example, a deviation of at least 15% is required on the sizes of these nanostructures and/or the distances between these nanostructures.

In the present invention, the diffuser is, in particular, intended to be arranged with point light sources, in particular LEDs.

A point light source extends from a source having dimensions in projection in the main extension plane less than a few tens of microns, in particular less than 30 µm, and preferably less than or equal to 15 µm.

The invention can however be implemented more broadly for different light sources, for example, extended sources.

The point or extended light sources can be polychromatic or monochromatic. The light transmitted by these sources is preferably a visible light.

In the case of a polychromatic source, the wavelength of interest of the light transmitted by this source can be the smallest wavelength transmitted by the source. It can possibly be the smallest wavelength transmitted by the source and received by the diffusion layer, in the case where an intermediate element between the source and the diffusion layer (for example, a filter or the transmission layer itself) filters a portion of this light, intentionally or not. It can also extend from a range of wavelengths of a few tens of nanometres, for example of the order of 100 nm or less.

In the case of a monochromatic or almost monochromatic source, the wavelength of interest is the only wavelength transmitted by this source or the wavelength mainly transmitted by this source.

Unless explicitly mentioned, it is specified that, in the scope of the present invention, the relative arrangement of a third layer inserted between a first layer and a second layer, does not compulsorily mean that the layers are directly in contact with one another, but means that the third layer is either directly in contact with the first and second layers, or separated from these by at least one other layer or at least one other element.

The steps of forming different layers and regions extend in the broadest sense: they can be carried out in several sub-steps which are not necessarily strictly successive.

By a material M-"based" substrate, layer, device, this means a substrate, a layer, a device comprising this material M only or this material M and possibly other materials, for example alloy elements, impurities or doping elements. Thus, a metal nanostructure-based diffusion layer can, for example, comprise tungsten (W) nanostructures or tungsten (W) and aluminium (Al) nanostructures, or also tungsten (W) nanostructures and a transparent encapsulation material.

By a layer or a material, "transparent to the light transmitted or to the wavelength of interest", or simply "transparent", this means a layer or a material letting at least 90% of the luminous intensity of the light having this wavelength of interest pass through.

The terms "substantially", "about", "of the order of" means "almost 10%" or, when it relates to an angular orientation, "almost 10°". Thus, a direction substantially normal to a plane means a direction having an angle of 90±10° with respect to the plane.

To determine the geometry of the diffuser and the compositions of the different layers, optical microscope or scanning electron microscope (SEM) analyses can be proceeded with.

The chemical compositions of the different layers or regions can be determined using the well-known EDX or X-EDS (energy dispersive x-ray spectroscopy) method.

This method is well-adapted to analyse the composition of small structures such as metal nanostructures. It can be implemented on metallurgic cross-sections within a scanning electron microscope (SEM).

These techniques allow, in particular to determine if the diffuser comprises a diffusion layer comprising metal nanostructures, or a plurality of metal structures, such as described in the present invention.

The diffuser according to the different aspect of the invention is intended to diffuse a visible light transmitted by a light source, preferably a point light source. As the case may be, the light transmitted by this source can, in particular, be transmitted, focused, diffused, backscattered, reflected, extracted by the diffuser. Before describing in detail the structural features and the manufacturing of this diffuser, some operational aspects of the diffuser are illustrated below through results obtained by simulation for different embodiments of the diffuser.

FIGS. 2A-2C, 3A-3C and 4A-4C shows results of simulations carried out by a method for calculating Finite Different Time Domain (FDTD), aiming to determine which is the part of light transmitted (specular transmission at $\Phi=0°$) and the part of light diffused (non-specular transmission for $\Phi\neq0°$) through a diffuser receiving a light transmitted by a source 1. For each of the simulations, the diffuser and the light source 1 are illustrated as a transverse cross-section in figures xA (x=2 . . . 4). The mappings of the electromagnetic field at the level of the diffusers are illustrated in figures xB (x=2 . . . 4). The angular diagrams of these diffusers are illustrated in figures xC (x=2 . . . 4).

Figure 2A:
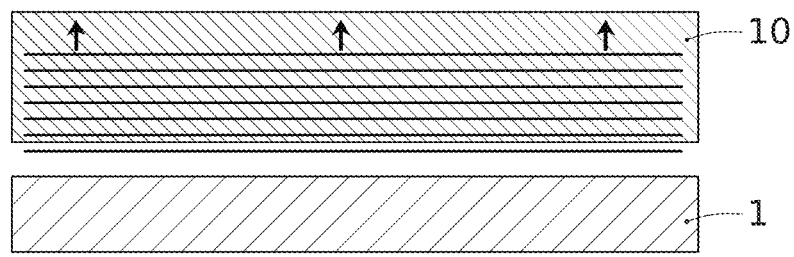
FIG. 2A schematically illustrates a diffuser comprising only a transmission layer.
Figure 2B:
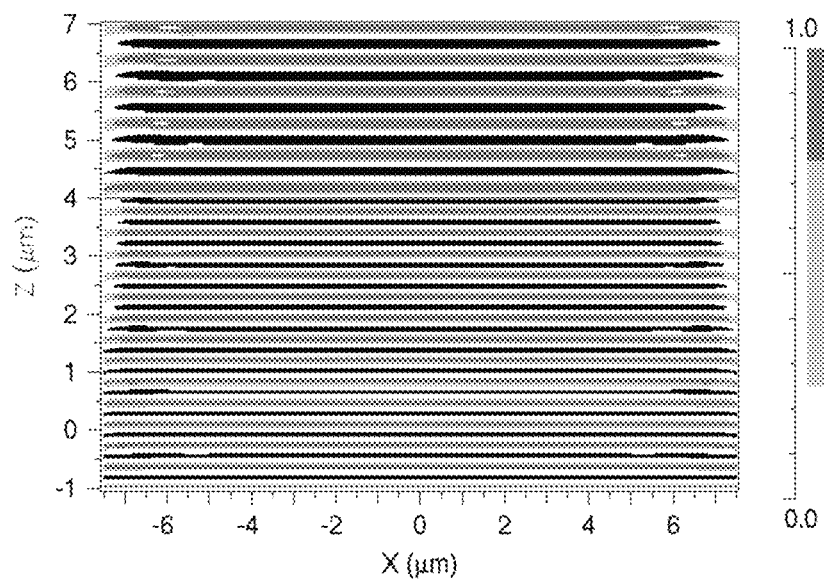
FIG. 2B shows a mapping of the electromagnetic field obtained by simulation for a light transmission through the diffuser of FIG. 2A.
Figure 2C:
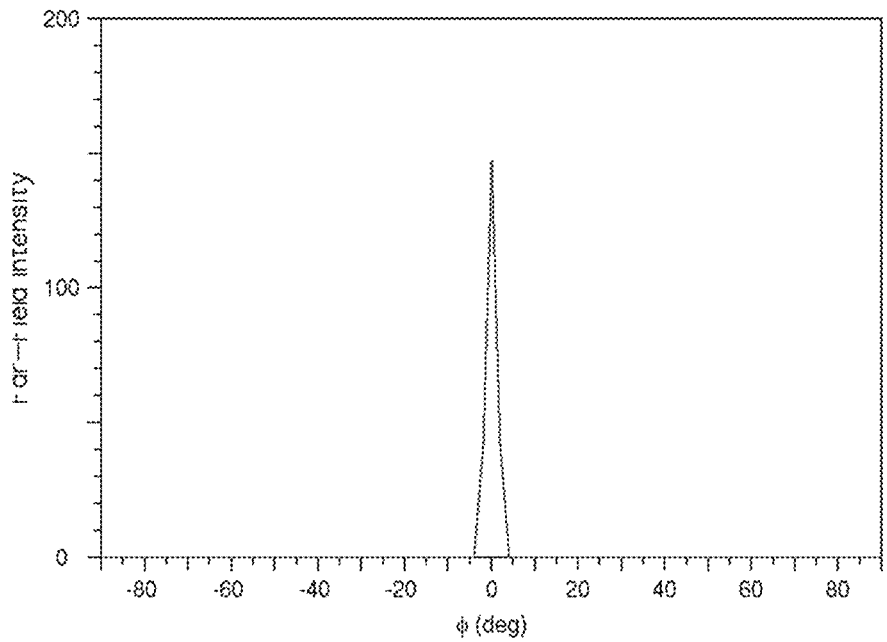
FIG. 2C shows an angular diagram obtained by simulation for a light transmission through the diffuser of FIG. 2A.

FIGS. 2A-2C taken as reference illustrate a visible light transmission (FIG. 2B) through a diffuser comprising only a transmission layer 10 (FIG. 2A). The angular diagram shows that the light coming from the source 1 is, in this case, only transmitted in a specular manner (FIG. 2C). The "diffuser" illustrated here is therefore not, strictly speaking, a device allowing to diffuse the light transmitted by the source. This case is presented so as to provide a first reference which can be used to compare the diffusion performances of the different embodiments of diffusers presented below.

Figure 3A:
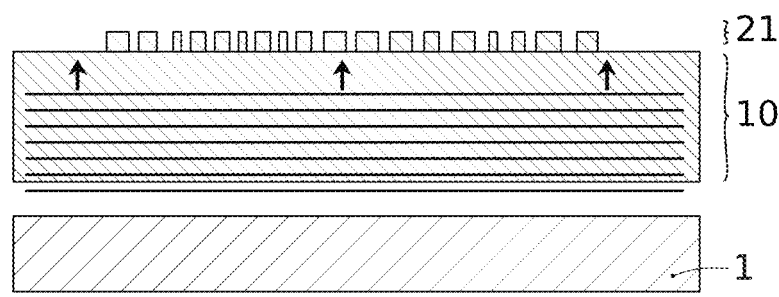
FIG. 3A schematically illustrates a diffuser according to an alternative solution identified in the scope of the development of the present invention, comprising a transmission layer and a disorganised dielectric nanostructure-based diffusion layer.
Figure 3B:
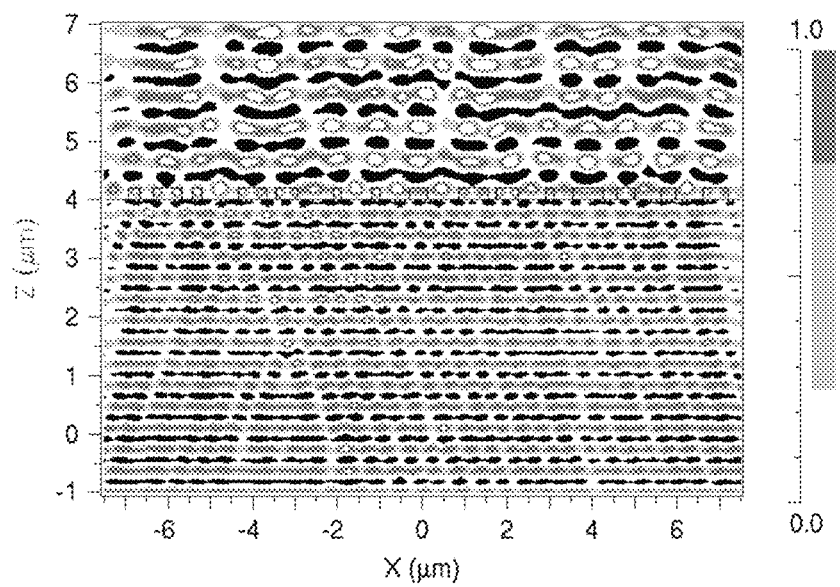
FIG. 3B shows a mapping of the electromagnetic field obtained by simulation for a light transmission through the diffuser of FIG. 3A.
Figure 3C:
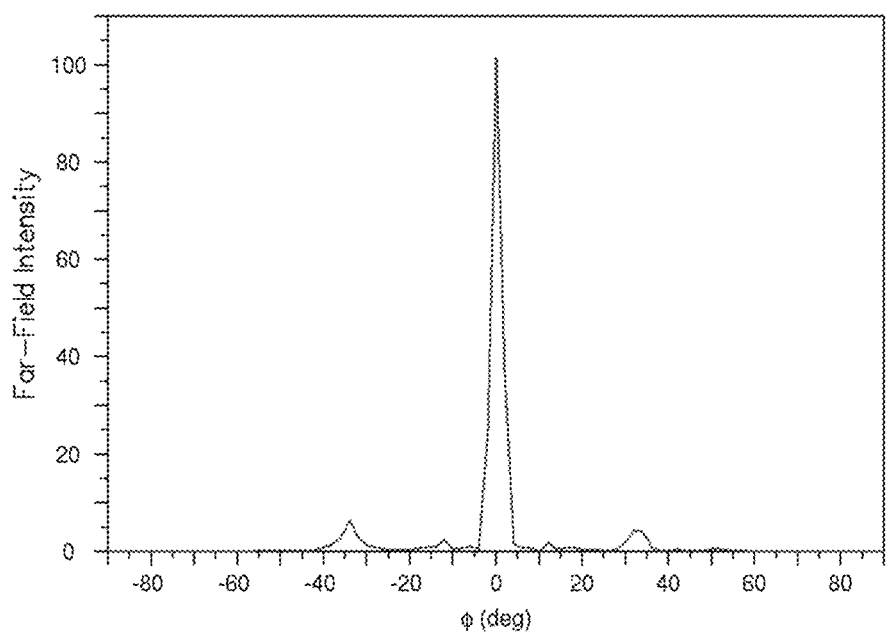
FIG. 3C shows an angular diagram obtained by simulation for a light transmission through the diffuser of FIG. 3A.

FIGS. 3A-3C illustrate a visible light transmission (FIG. 3B) through a diffuser comprising a transmission layer 10 and a disorganised dielectric nanostructure-based diffusion layer 21 (FIG. 3A). The angular diagram shows that the light transmitted by the source 1 is, in this case, mainly transmitted in a specular manner. The part of light diffused is low (FIG. 3C).

Such a diffuser is therefore a solution allowing to diffuse the light transmitted by a point light source. This solution however does not allow to effectively diffuse light and is not the aim of the present invention.

Figure 4A:
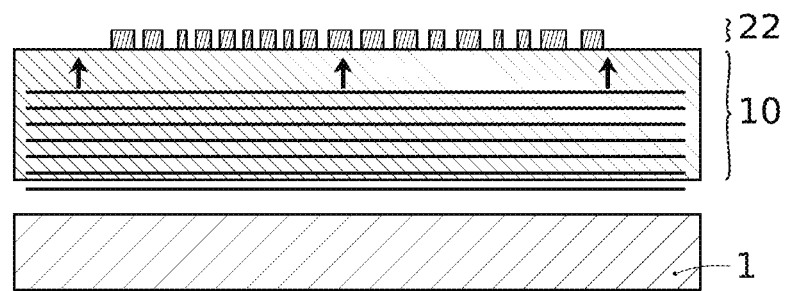
FIG. 4A schematically illustrates a diffuser comprising a transmission layer and a disorganised metal nanostructure-based diffusion layer, according to an embodiment of the present invention.
Figure 4B:
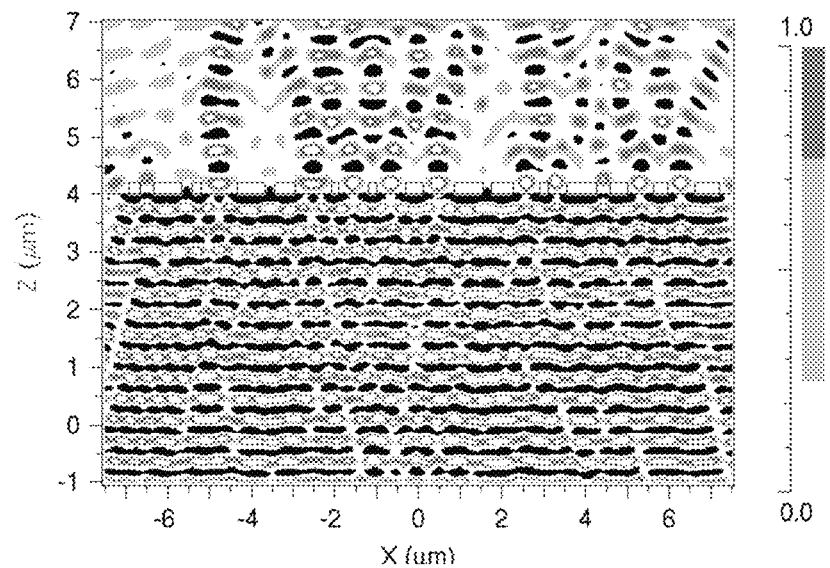
FIG. 4B shows a mapping of the electromagnetic field obtained by simulation for a light transmission through the diffuser of FIG. 4A.
Figure 4C:
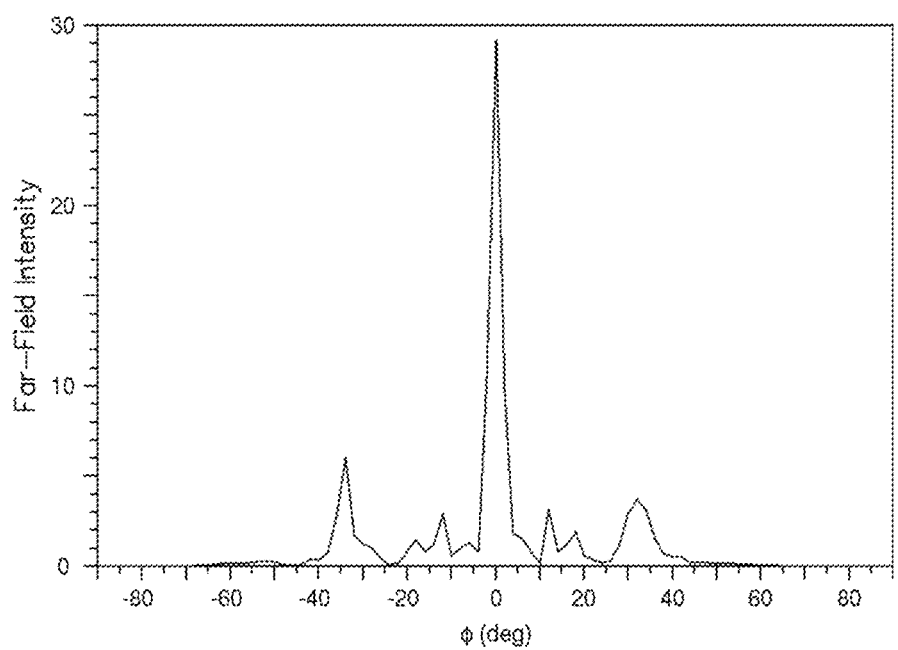
FIG. 4C shows an angular diagram obtained by simulation for a light transmission through the diffuser of FIG. 4A.

FIGS. 4A-4C illustrate a visible light transmission (FIG. 4B) through a diffuser according to the invention, comprising a transmission layer 10 and a disorganised metal nanostructure-based diffusion layer 22 (FIG. 4A). The angular diagram shows that the part of light diffused is in this case, broadly increased with respect to the preceding diffuser (FIG. 4C).

The metal nanostructures allow a diffusion of visible light, significantly more effective than dielectric nanostructures. This is, in particular, due to the contrast of refraction indices between the metal nanostructures and the generally transparent dielectric material-based transmission layer.

Preferably, but optionally, this diffuser further comprises a focalisation layer configured to focus the light transmitted on a metal nanostructure of the plurality of metal nanostructures. This allows to increase the part of light diffused by the diffuser. The light transmitted by the source, in particular a point source, is thus focused at the level of a nanostructure, preferably one single nanostructure. The focalisation allows to induce a divergence of light beyond the nanostructure. This divergence increases the part of the light transmitted in a non-specular manner.

FIGS. 5A-5C, 6A-6C, 7A-7C and 8A-8C show other results of simulations done by FDTD, for different embodiments of diffusers comprising a focalisation layer. For each of the simulations, the diffuser and the light source 1 are illustrated as a transverse cross-section in figures xA (x=5 . . . 8). The mappings of the electromagnetic field at the level of the diffusers are illustrated in figures xB (x=5 . . . 8). The angular diagrams of these diffusers are illustrated in figures xC (x=5 . . . 8).

Figure 5A:
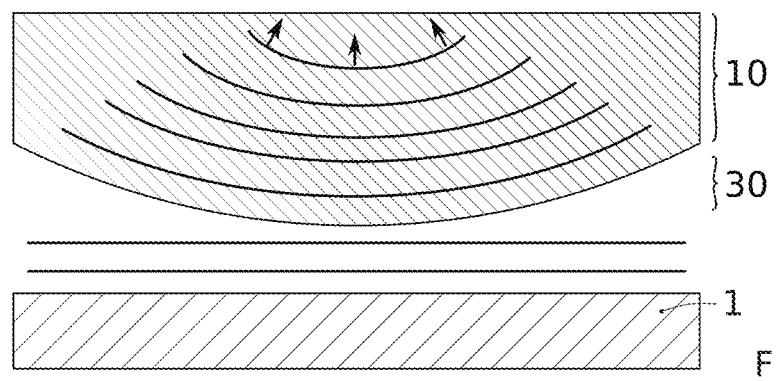
FIG. 5A schematically illustrates a diffuser comprising a transmission layer and a focalisation layer.
Figure 5B:
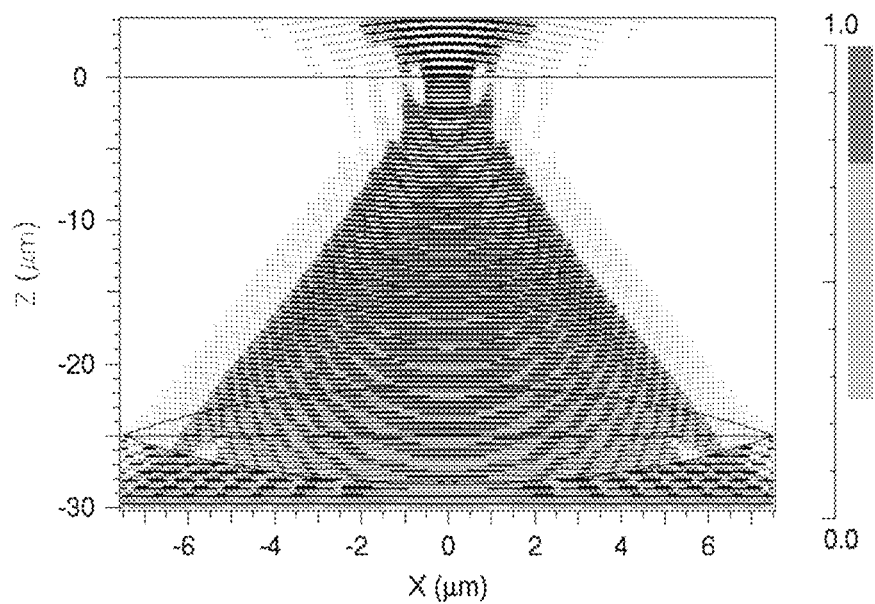
FIG. 5B shows a mapping of the electromagnetic field obtained by simulation for a light transmission through the diffuser of FIG. 5A.
Figure 5C:
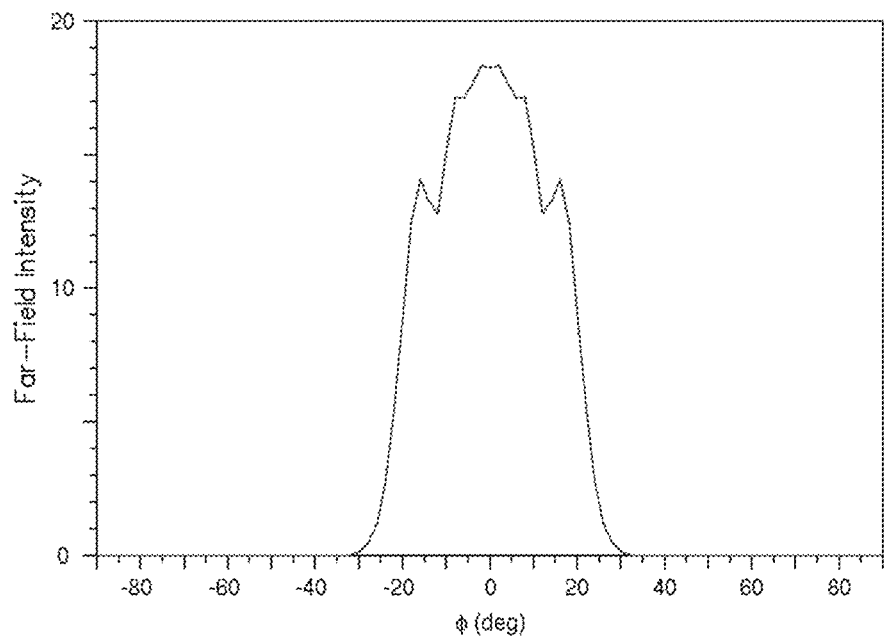
FIG. 5C shows an angular diagram obtained by simulation for a light transmission through the diffuser of FIG. 5A.

FIGS. 5A-5C illustrate a light transmission (FIG. 5B) through a diffuser comprising a transmission layer 10 and a focalisation layer 30 (FIG. 5A). The angular diagram (FIG. 5C) shows that the part of light transmitted in a non-specular manner is, in this case, broadly increased with respect to the case of reference illustrated in FIGS. 2A-2C. The "diffuser" illustrated here is however not, strictly speaking, a device allowing to diffuse the light transmitted by the source 1. This case is presented so as to provide a second reference which can be used to compare the diffusion performances of the different embodiments of diffusers comprising a focalisation layer, such as presented below.

In the case of a diffuser comprising a diffusion layer with the basis of one or a plurality of metal nanostructures, the focalisation of the light on only a few nanostructures, even on one single nanostructure, allows to avoid any network effect, and therefore favours an isotropic diffusion of light.

Figure 6A:
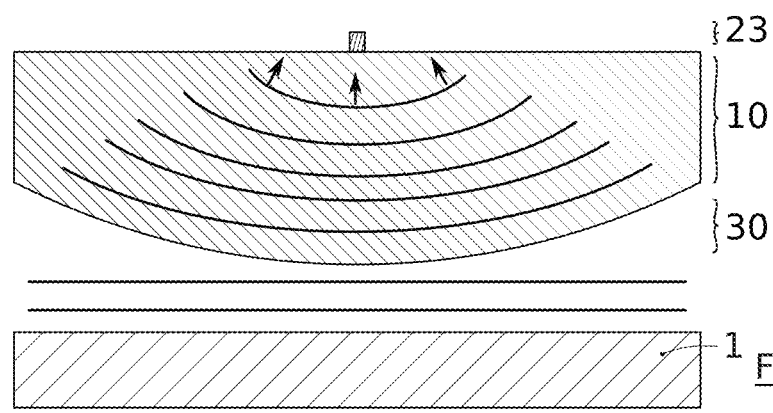
FIG. 6A schematically illustrates a diffuser comprising a transmission layer, a focalisation layer and a metal nanostructure-based diffusion layer, according to an embodiment of the present invention.

According to a possibility illustrated in FIG. 6A, the diffusion layer 23 of this diffuser can be with the basis of one or of at least one metal nanostructure.

Figure 6B:
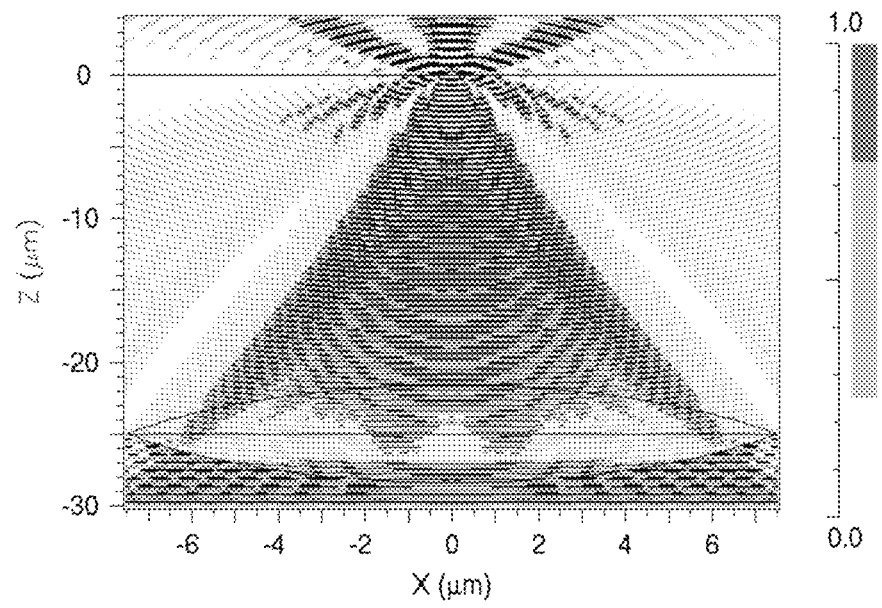
FIG. 6B shows a mapping of the electromagnetic field obtained by simulation for a light transmission through the diffuser of FIG. 6A.
Figure 6C:
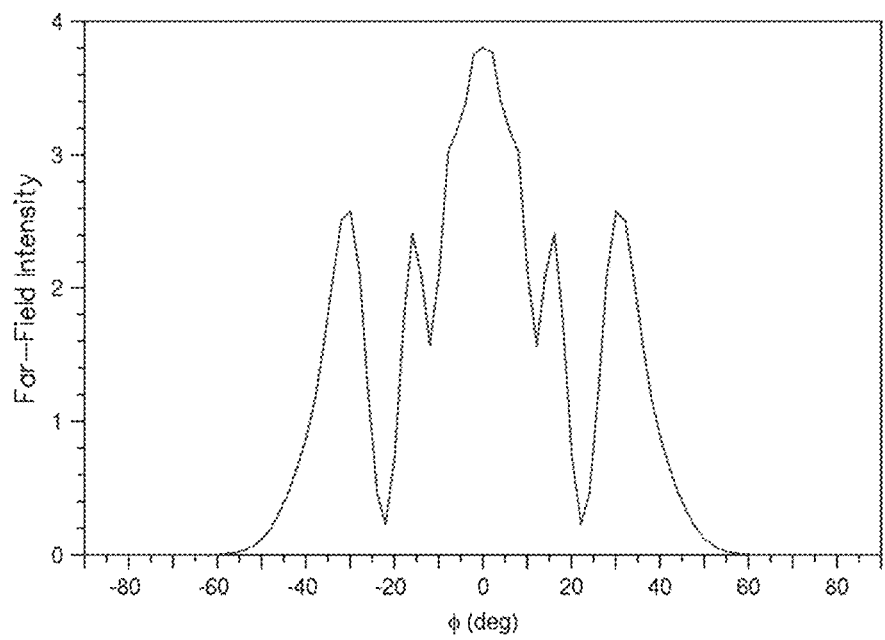
FIG. 6C shows an angular diagram obtained by simulation for a light transmission through the diffuser of FIG. 6A.

FIGS. 6A-6C illustrate a light transmission (FIG. 6B) through such a diffuser comprising a transmission layer 10, a focalisation layer 30 and a metal nanostructure-based diffusion layer 23 (FIG. 6A). The angular diagram (FIG. 6C) shows that the part of light diffused is increased with respect to the case illustrated in FIGS. 4A-4C. This diagram is further symmetrical, which conveys the isotropic character of such a diffusion.

According to a possibility, the diffusion layer of this diffuser can be with the basis of a plurality of metal nanostructures. In this case, only a few metal nanostructures are actually illuminated after focalisation of the light. The network effects are, in this case, highly limited, even removed.

Preferably, but optionally, the diffuser further comprises a reflection layer situated between the diffusion layer and the focalisation layer within the transmission layer, parallel to the diffusion layer and having at least one opening facing the metal nanostructure on which the light transmitted is focused. This allows to increase the total transmission of the diffuser.

The total transmission of the diffuser corresponds to the part of the light that an observer can perceive looking at the light source through the diffuser.

The diffusion by the metal nanostructure(s) is done according to a multitude of directions, partially in the same direction as the light transmitted (it is the light transmitted and diffused that the observer can perceive) and partially in a direction opposite that of the light transmitted (it is the backscattered light that the observer cannot perceive).

The reflection layer advantageously allows to reflect a part of the backscattered light in the direction of the observer. The total transmission of the diffuser is therefore improved.

Figure 7A:
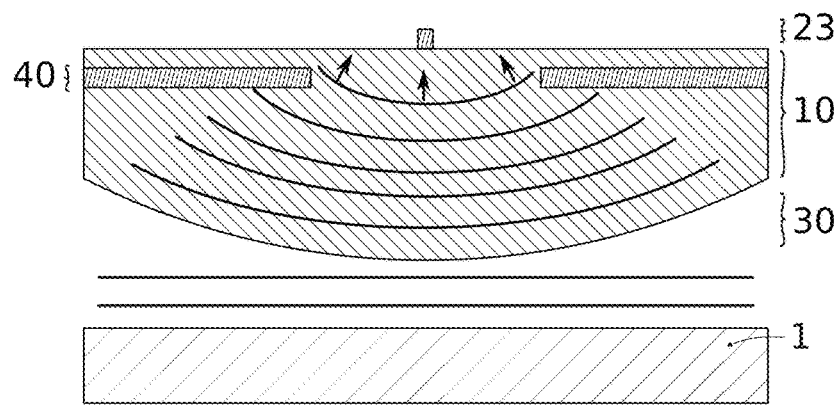
FIG. 7A schematically illustrates a diffuser comprising a transmission layer, a focalisation layer, a reflection layer and a metal nanostructure-based diffusion layer, according to an embodiment of the present invention.

According to a possibility illustrated in FIG. 7A, the diffusion layer 23 of this diffuser comprising a reflection layer 40 can be with the basis of one or of at least one metal nanostructure.

Figure 7B:
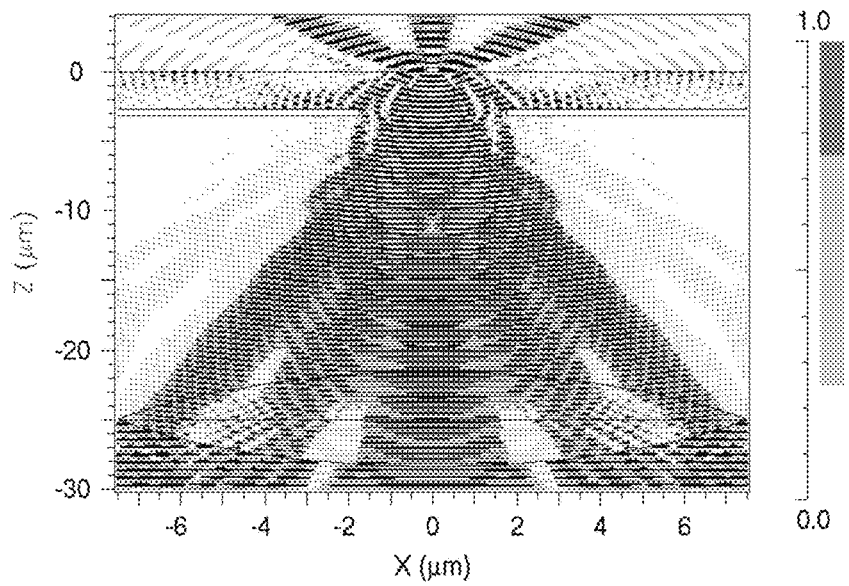
FIG. 7B shows a mapping of the electromagnetic field obtained by simulation for a light transmission through the diffuser of FIG. 7A.
Figure 7C:
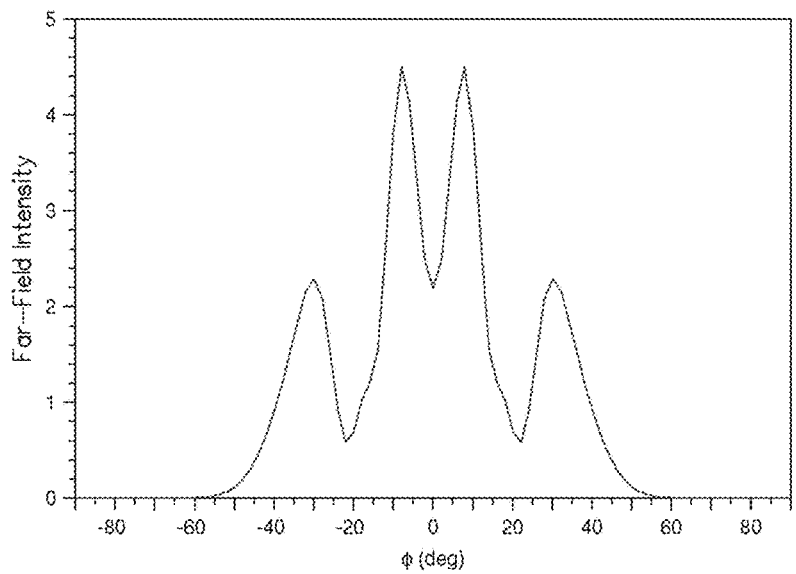
FIG. 7C shows an angular diagram obtained by simulation for a light transmission through the diffuser of FIG. 7A.

FIGS. 7A-7C illustrate a light transmission (FIG. 7B) through such a diffuser comprising a transmission layer 10, a focalisation layer 30, a reflection layer 40 and a metal nanostructure-based diffusion layer 23 (FIG. 7A). The angular diagram shows that the total transmission, proportional to all of the function defining the curve of FIG. 7C, is increased with respect to the preceding case illustrated in FIGS. 6A-6C. The total transmission of the diffuser, of the order of 50% of the light transmitted in the preceding case, can thus be increased up to about 70% of the light transmitted.

Figure 8A:
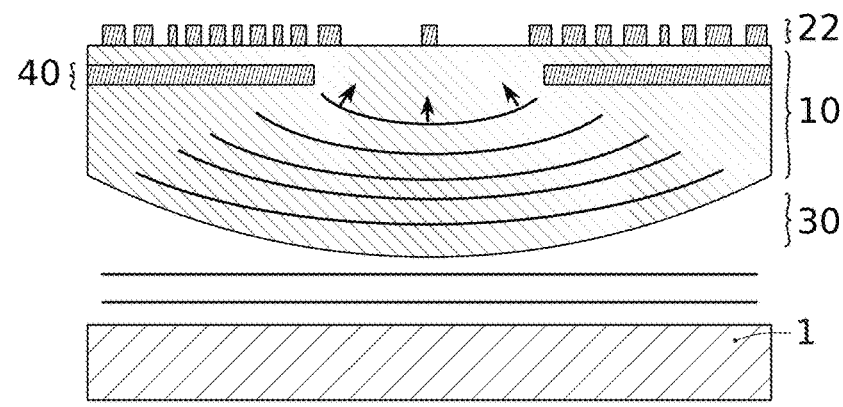
FIG. 8A schematically illustrates a diffuser comprising a transmission layer, a focalisation layer, a reflection layer and a diffusion layer with the basis of a plurality of metal nanostructures, according to an embodiment of the present invention.

According to a possibility illustrated in FIG. 8A, the diffusion layer 22 of this diffuser comprising a reflection layer 40 can be with the basis of a plurality of metal nanostructures. This advantageously allows to favour the extraction of a so-called low-angled part of the light backscattered by the metal nanostructure at the focalisation point.

The low-angled part of the backscattered light comprises light beams of which the propagation direction forms an angle with the diffusion layer less than the total inner reflection angle of the transmission layer. These beams are therefore trapped within the transmission layer between the diffusion layer and the reflection layer, in the absence of singularities at the level of one and/or the other of these interfaces. The presence of a plurality of metal nanostructures in the diffusion layer allows to generate singularities favouring the extraction of these light beams of the transmission layer in the direction of the observer. The total transmission is therefore increased.

Figure 8B:
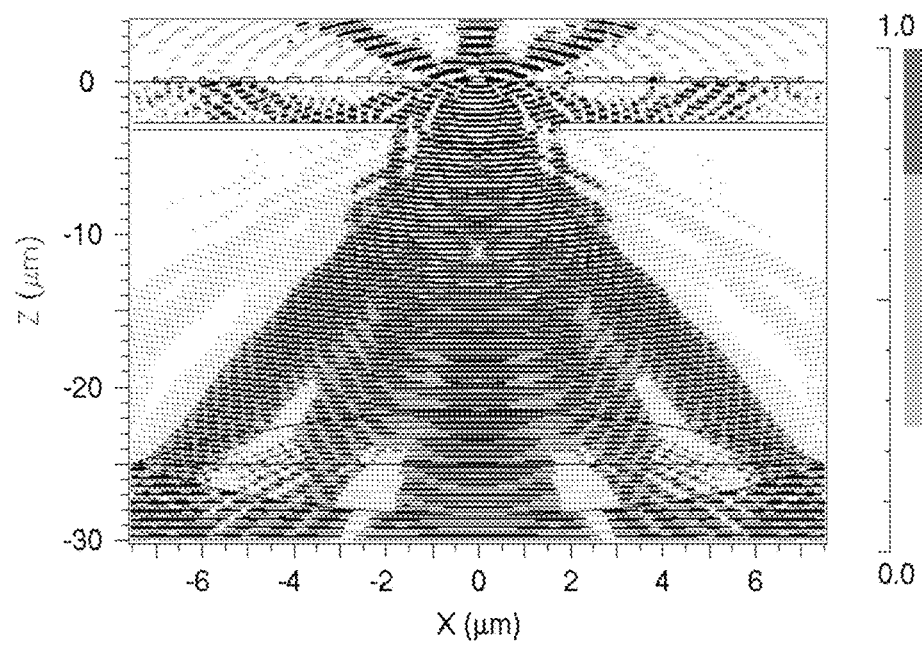
FIG. 8B shows a mapping of the electromagnetic field obtained by simulation for a light transmission through the diffuser of FIG. 8A.
Figure 8C:
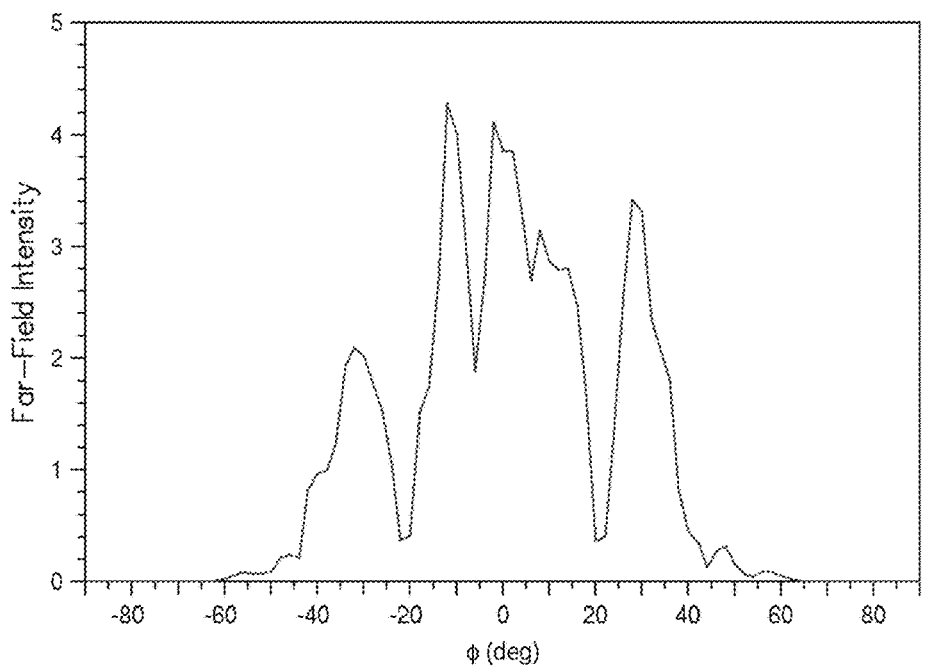
FIG. 8C shows an angular diagram obtained by simulation for a light transmission through the diffuser of FIG. 8A.

FIGS. 8A-8C illustrates a light transmission (FIG. 8B) through a diffuser comprising a transmission layer 10, a focalisation layer 30, a reflection layer 40 and a diffusion layer 22 with the basis of a plurality of metal nanostructures (FIG. 8A). The total transmission of this diffuser, deductible from the angular diagram (FIG. 8C), is increased by about 5% with respect to the preceding case illustrated in FIGS. 7A-7C.

Moreover, the angular diagram of such a diffuser is enlarged. The diffusion of the light is optimised.

A first embodiment of a diffuser according to the invention will now be described in reference to FIGS. 9A, 9B.

According to this first embodiment, the diffuser comprises a transmission layer 10 made of a transparent material in at least one portion of the range of wavelength of the visible, in particular at the wavelengths of the light to be transmitted.

This transparent material can be silicon oxide-, silicon nitride, sapphire-based.

The transmission layer 10 forms, in particular, a transparent support for the diffusion layer 22 of the diffuser.

This diffusion layer 22 comprises a plurality of metal nanostructures 200 also called metal structures 200 or particles 200. These metal nanostructures 200 are separate from one another and can resemble metal particles. They are situated at a distance from one another. Thus, two metal nanostructures 200 are separated by a material different from the metal material constituting the metal nanostructures 200. Typically, two metal nanostructures 200 are separated by the material forming the transmission layer 10.

Figure 9A:
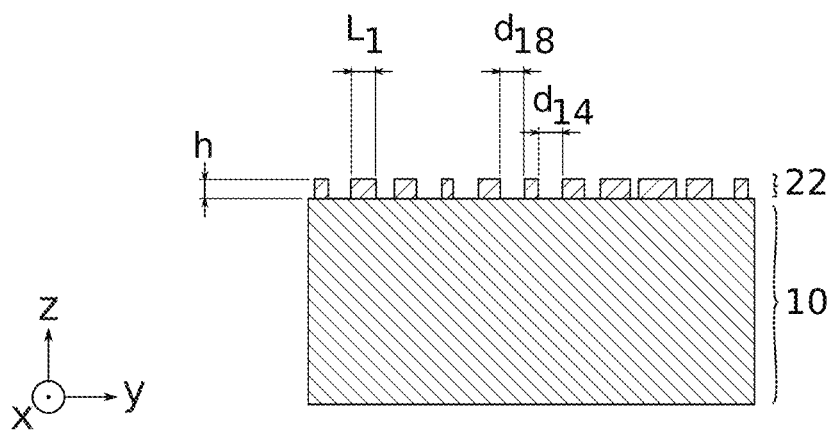
FIG. 9A schematically illustrated, as a transverse cross-section, a diffuser comprising a transmission layer and a diffusion layer with the basis of a plurality of metal nanostructures, according to an embodiment of the present invention.

The metal nanostructures 200 can have a height h comprised between 100 nm and 500 nm (FIG. 9A).

These nanostructures 200 have first and second dimensions L1, L2 in projection in the main extension plane xy less than 650 nm. These dimensions, called main extension dimensions, are in particular less than the wavelengths of interest of the light to be diffused.

The nanostructures 200 can have main extension dimensions L1, L2 comprised between 100 nm and 500 nm, preferably between 100 nm and 400 nm. These dimensions L1, L2 are carried by two directions of the plane xy orthogonal to one another, for example, the directions x and y. This allows to favour an isotropic diffusion of the light.

Figure 9B:
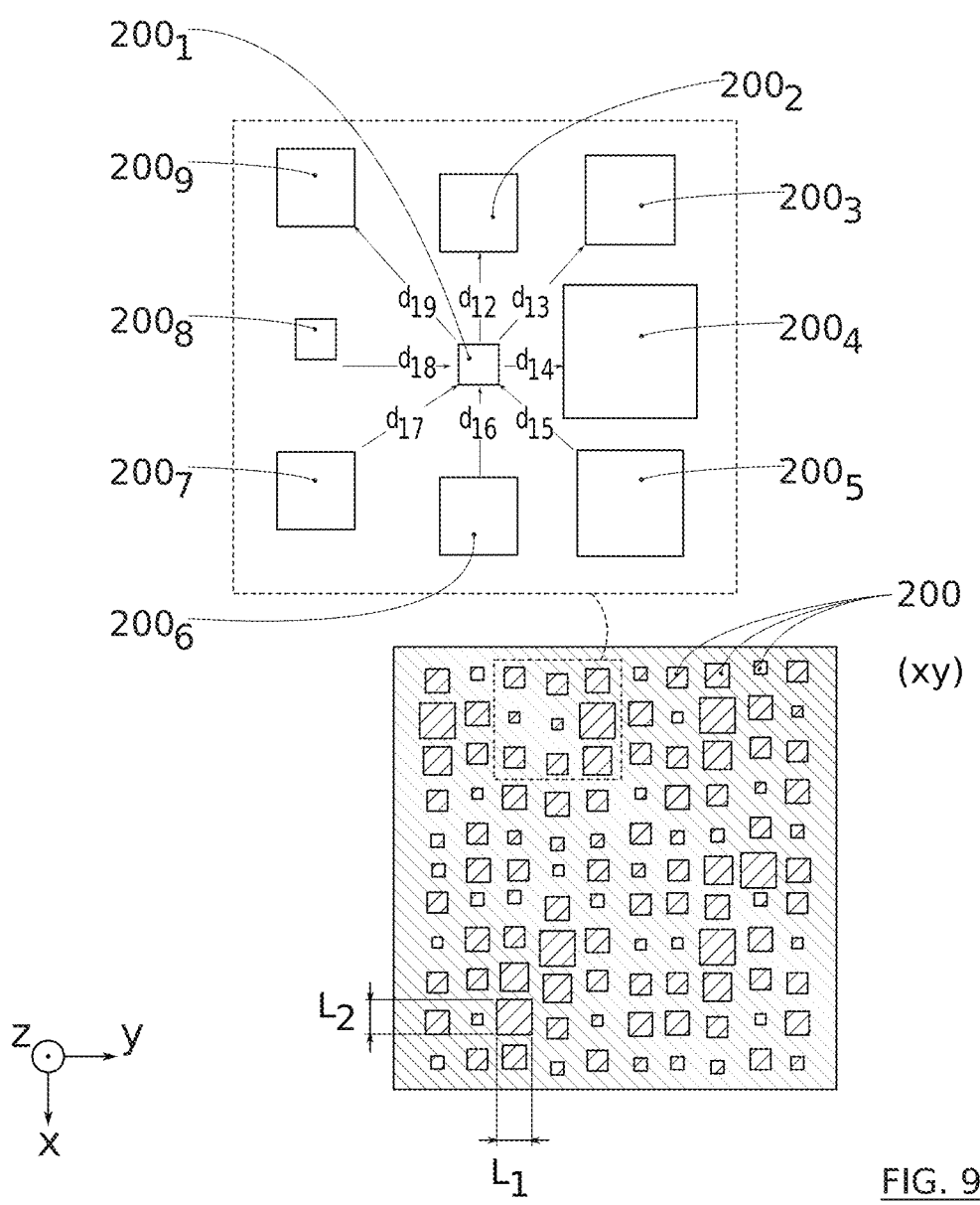
FIG. 9B schematically illustrates, as a top view, a diffuser according to the embodiment of FIG. 9A.

In the example illustrated in FIG. 9B, for all the metal nanostructures 200, the first dimensions L1 extend along all the first directions parallel to the axis x of the coordinate system xyz and the second directions L2 extend along all the second directions parallel to the axis y of the coordinate system xyz. This example is not limiting and according to another possibility, the first directions according to which extend the first dimensions L1 are not all parallel to one another, and, corollarily, the second directions—orthogonal to the first directions—according to which extend the second dimensions L2 are not all parallel to one another.

The main extension dimensions can be such that L1=L2. This also allows to favour an isotropic diffusion of light.

The nanostructures can have different shapes in projection in the main extension plane xy, for example, square shapes such as represented in FIG. 9B, or round, or having a degree of symmetry allowing to favour an isotropic diffusion. The nanostructures 200 preferably have an axis of symmetry of order n normal to the main extension plane xy, with n≥3. Subsequently, they have an invariance by rotation of an angle $2\pi/n$.

They preferably have varied sizes. The sizes of the nanostructures 200, for example, the critical dimensions thereof or the surfaces thereof in projection in the plane xy, preferably have a significant variation, for example of the order of 200%, even 300%, even 500%, between the smallest nanostructure 200 and the largest nanostructure 200 of the diffusion layer 22. A factor 2, even 3, even 5 between the smallest and the largest nanostructures allows to obtain a relatively wide range of sizes.

The variation of the surfaces of the metal nanostructures can thus be such that Smax≥x*Smin, with Smax and Smin respectively the maximum and minimum surfaces within the diffusion layer, and x=2, preferably x=3 and preferably x=5.

The variation of the critical dimensions of the metal nanostructures can thus be such that Tmax≥x*Tmin, with Tmax and Tmin respectively the maximum and minimum dimensions within the diffusion layer, and x=2, preferably x=3 and preferably x=5.

The variation of the dimensions of the metal nanostructures 200 can only relate to the dimension L1 or can relate only to the dimension L2 or relate to both the dimension L1 and the dimension L2.

Furthermore, the size distribution of the nanostructures over this range of sizes is preferably sufficiently staggered.

In the case of a size distribution of narrow or Gaussian nanostructures, the formation of an organised network of nanostructures is indeed favoured. The high degree of order of this ordered network favours certain interactions with the incident wave of the light transmitted by the source (for example, by resonance). This is what is called below, "network effect". Consequently, light is extracted via this organised network according to certain favoured directions only. In this case, the diffusion is not isotropic.

On the contrary, a staggered size distribution of the nanostructures favours the formation of a disorganised network of nanostructures. The low degree of order of this disorganised network limits the network effect. Consequently, the light is extracted via this disorganised network in a more isotropic manner. The angular diagram of diffusion is improved (case shown in FIG. 4C).

According to an advantageous possibility, the size distribution of the nanostructures 200, for example according to the critical dimension or along an average dimension L1+L2/2, is preferably as staggered as possible in the range 100 nm to 500 nm or in the range 100 nm to 400 nm. For example, within the diffusion layer 22 among the plurality of metal nanostructures 200, at least a few metal nanostructures (for example, at least 10, preferably at least 20) have main extension dimensions less than 250 nm and at least a few metal nanostructures (for example, at least 10, preferably at least 20) have main extension dimensions greater than 350 nm.

The metal nanostructures 200 are preferably also dispersed or distributed over the transmission layer 10 randomly or in a disorganised manner. The metal nanostructures 200 have, in particular, a plurality of separation distances $d_{ij}$ between adjacent nanostructures (FIG. 9B).

These separation distances $d_{ij}$, also called interparticle distances, are preferably comprised in the range 100 nm to 1000 nm.

The separation distances preferably have a significant variation, for example of the order of 200%, even 300%, even 500%, between the smallest distance and the largest separation distance between two adjacent nanostructures of the diffusion layer 22. A factor 2, even 3, even 5 between the smallest and the largest separation distances allows to obtain a relatively wide range of distances.

Furthermore, the distribution of the interparticle distances over this range is preferably sufficiently staggered.

In the case of a narrow of Gaussian distribution of interparticle distances favours the formation of an organised network of nanostructures having a high degree of order.

On the contrary, a staggered distribution of interparticle distances favours the formation of a disorganised network of nanostructures having a low degree of order.

According to an advantageous possibility, the distribution of the interparticle distances of the nanostructures 200 is preferably as staggered as possible in the range 100 nm to 1000 nm. This allows to limit the network effect.

To obtain a staggered distribution of the interparticle distances, at least some of the adjacent metal nanostructures can have separation distances less than 500 nm, and at least some of the others of the adjacent metal nanostructures can have separation distances greater than 600 nm. According to an example illustrated in FIG. 9B, for a nanostructure $200_1$ surrounded by closest 8 neighbouring nanostructures $200_2$, $200_3$, $200_4$, $200_5$, $200_6$, $200_7$, $200_8$, $200_9$, the interparticle distances d12, d13, d14, d15, d16, d17, d18, d19 are preferably different from one another, and preferably sufficiently different such that a portion of said distances, for example d12, d14, d16, is less than 500 nm, and that another portion of said distances, for example, d13, d17, d18, d19, is greater than 600 nm.

According to another non-illustrated example, the interparticle distances between the nanostructure $200_1$ and each of the nanostructures $200_2$, $200_3$, $200_4$, $200_5$, $200_6$, $200_7$, $200_8$, $200_9$ adjacent to this nanostructure $200_1$ are all different from one another.

The embodiment of such a diffusion layer 22 can advantageously be done by standard planar microelectronic technologies (deposition, lithography, etching), as outlined below in the description.

It can be alternatively made by one single step of depositing metal nanoparticles having the size features mentioned above. This deposition can be done from colloidal nanoparticle solutions on the market, by gravity deposition and/or by well-known electrodeposition or electrophoresis techniques.

Other embodiments of the diffuser according to the invention can be considered. Only the separate features of the first embodiment are described below, the other non-described features being considered identical to those of the first embodiment.

A second embodiment of a diffuser according to the invention will now be described in reference to FIGS. 10A to 10E.

According to this second embodiment, the diffuser comprises a transmission layer 10, a diffusion layer 23 comprising at least one metal nanostructure 201, 200a, and a focalisation layer 30. The transmission layer 10 is inserted between the diffusion layer 23 and the focalisation layer 30.

The diffusion layer 23 can comprise one single metal nanostructure 201. A diffusion layer 22 comprising a plurality of metal nanostructures 200 can alternatively be used.

The focalisation layer 30 can have a continuity of material with the transmission layer 10. In the supporting figures, the focalisation and transmission layers 30, 10 are materialised by brackets. This allows to distinguish at least operationally these different layers, even if they cannot be structurally separate.

The focalisation layer 30 is configured to focus the light transmitted by the source on the nanostructure 201, or on a nanostructure 200a of the plurality of metal nanostructures 200, or on a few nanostructures 200a of the plurality of metal nanostructures 200, for example, 2 to 10.

The light transmitted by the source, for example, a flat incident wave arriving on the focalisation layer 30, is thus propagated up to the nanostructure 201, 200a in an illumination cone at the top of which the nanostructure is located 201, 200a.

The focalisation layer 30 therefore allows to improve the diffusion (non-specular transmission) of the diffuser. The association of this focalisation layer 30 to one single metal nanostructure 201 or to only a few nanostructures 200a further allows to improve the isotropic character of the diffusion (case outlined in FIG. 6C).

Figure 10A:
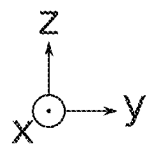
FIG. 10A schematically illustrates, as a transverse cross-section, a diffuser comprising a transmission layer, a focalisation layer and a metal nanostructure-based diffusion layer, according to an embodiment of the present invention.
Figure 10A:
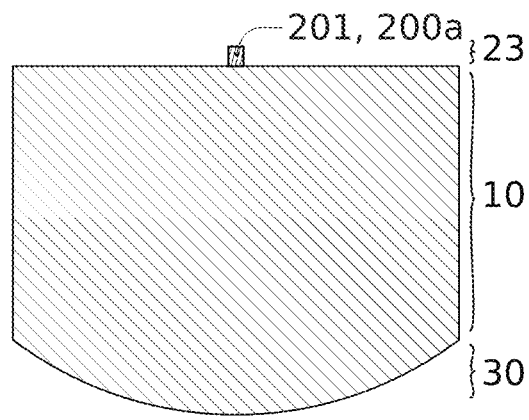

According to a possibility illustrated in FIG. 10A, the focalisation layer 30 is presented in the form of a lens, also called microlens, for example, refractive. This microlens 300 typically forms a relief of a side of the transmission layer 10 opposite the side of the transmission layer 10 supporting the diffusion layer 23.

The width or the diameter D of such a microlens, taken parallel to the main extension plane, corresponds to the width of the diffuser. It is preferably comprised between 5 µm and 30 µm, for example about 15 µm.

The focal distance of this microlens 300, which corresponds substantially to the thickness H' of the transmission layer 10, is typically of the order of a few microns, for example 8≤H'≤12 µm, to a few hundred microns, for example H'≈700 µm for a glass substrate.

Figure 10B:
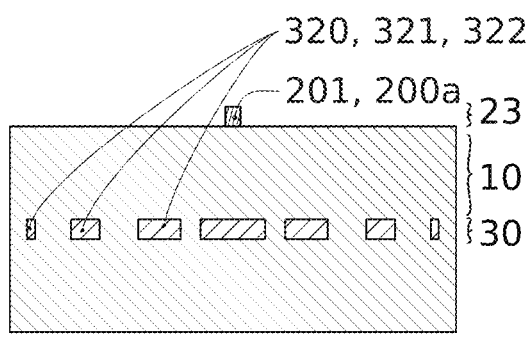
FIG. 10B schematically illustrates, as a transverse cross-section, a diffuser comprising a transmission layer, a focalisation layer and a metal nanostructure-based diffusion layer, according to another embodiment of the present invention.
Figure 10C:
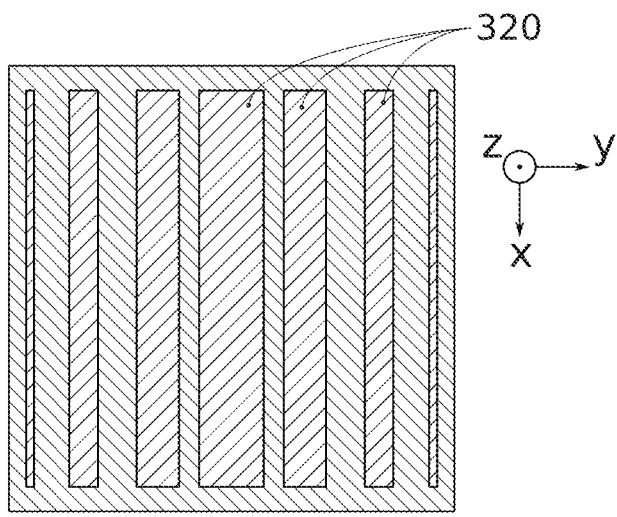
FIGS. 10C to 10E schematically illustrate, as a top view, different focalisation layers of a diffuser according to the embodiment of FIG. 10B.
Figure 10D:
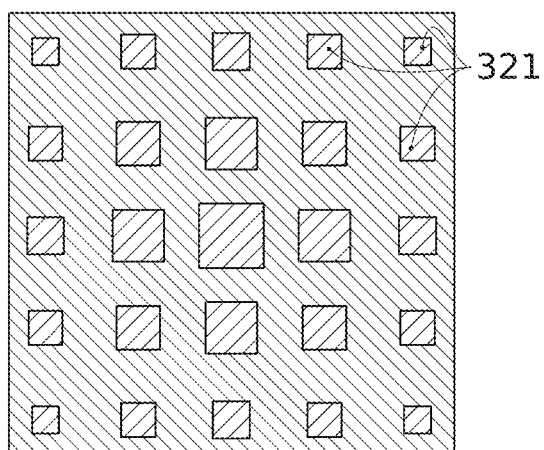

According to a possibility illustrated in FIG. 10B, the focalisation layer 30 is presented in the form of a Fresnel lens 303.

Such a Fresnel lens can comprise, in a plane parallel to the main extension plane, geometric patterns 300, 301, 302 made of a material having a relatively high refraction index with respect to the surrounding transparent material. The principle of such a Fresnel lens 303 is broadly known.

Different geometric patterns 300, 301, 302 can thus allow a focalisation of the light on the nanostructure(s) 201, 200.

Figure 10E:
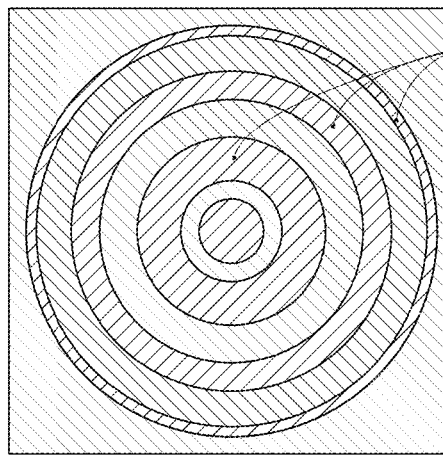

These patterns can, for example, comprise:

Parallel strips 300 of width progressively decreasing from the centre of the lens (FIG. 10C), Squares 301 or disks of width or of diameter progressively decreasing from the centre of the lens (FIG. 10D), Concentric rings 302 of width progressively decreasing from the centre of the lens (FIG. 10E).

Such a focalisation layer comprising a Fresnel lens can advantageously be made by standard microelectronic planar technologies (deposition, lithography, etching), as outlined below in the description.

The total bulk of a diffuser comprising a Fresnel lens can be reduced with respect to a diffuser comprising a refractive microlens. In particular, the height of this diffuser can be decreased.

A third embodiment of a diffuser according to the invention will now be described in reference to FIGS. 11 and 12.

According to this third embodiment, the diffuser comprises a transmission layer 10, a diffusion layer 23 comprising at least one metal nanostructure 201 or a diffusion layer 22 comprising a plurality of metal nanostructures 200a, 200b, a focalisation layer 30, and a reflection layer 40. As in the preceding example, the focalisation layer 30 can be formed by a microlens in continuity of the transmission layer 10.

The reflection layer 40 is inserted between the diffusion layer 22, 23 and the focalisation layer 30. It can be disposed within the transmission layer 10, at a distance d from the diffusion layer 22, 23, and at a distance H from the focalisation layer 30.

The reflection layer 40 is configured to reflect a portion of the light backscattered by the metal nanostructure(s) 201, 200a on which the light transmitted is focused. The backscattered light indeed has a propagation direction opposite that of the light backscattered in the direction of an observer. The reflection layer 40 allows to reflect a portion of this light backscattered in the direction of the observer.

This reflection layer 40 thus allows to improve the total transmission of the diffuser.

Figure 11:
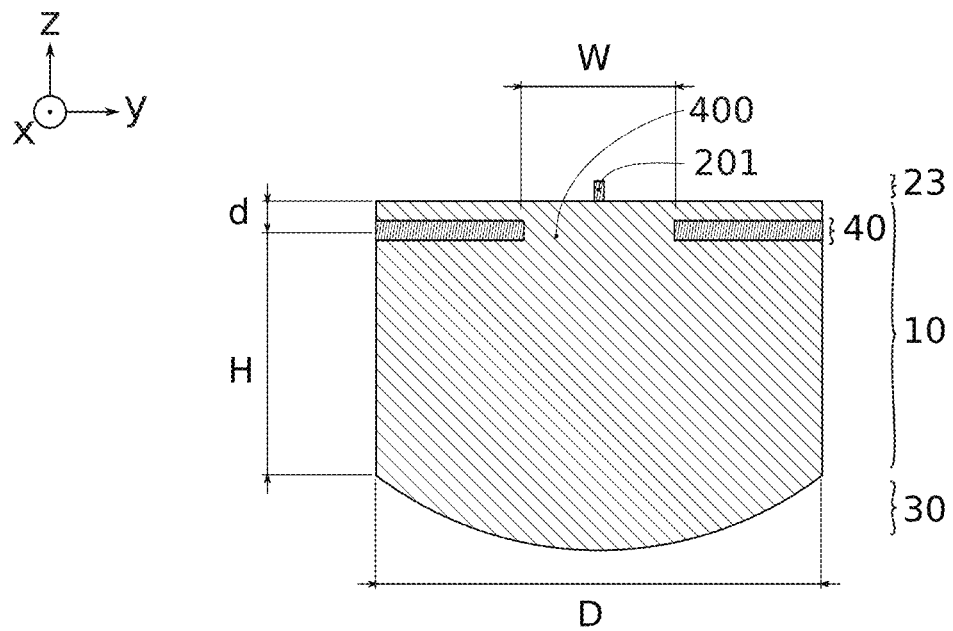
FIG. 11 schematically illustrates, as a transverse cross-section, a diffuser comprising a transmission layer, a focalisation layer, a reflection layer and a metal nanostructure-based diffusion layer, according to an embodiment of the present invention.

The reflection layer 40 has an opening 400 approximately centred on the metal nanostructure 201, 200a of the diffusion layer 23, 22. This opening 400 has a dimension by width or an opening diameter W. This opening diameter W preferably verifies the ratio:

$$W = \frac{D \cdot d}{H + d} \quad \text{[Math. 1]}$$

where D is the diameter of the focalisation lens 300, 303, d is the distance separating the diffusion layer 22, 23 of the reflection layer 40 (d can be taken between the faces facing the layers in question, or between the centres of the layers in question), H is the distance separating the reflection layer 40 of the focalisation layer 30 (FIG. 11).

In practice, a typical value of H can be 700 µm for a glass substrate, a typical value of D can be 15 µm for the lens.

For a non-flat incident wave, for example a light transmitted by an LED having a low divergence and forming a transmission cone, it is advantageous to decrease the value of H. This allows to limit a loss of transmission for light beams having angles of incidence close to the edges of the transmission cone of the LED.

It is also particularly advantageous to maximise the value of d in order to maximise the opening 400 diameter W. This allows to increase an angular opening for the backscattered light.

In practice, a typical value of d which can be achieved by standard microelectronic planar technologies is comprised between 1 µm and 20 µm.

For a given value d, for example d=3 µm, or d=7 µm, the ratio [Math.1] above allows to optimise the sizing of the opening W.

If $$W < \frac{D \cdot d}{H + d}$$

a portion of the light transmitted by the source does not reach up to the nanostructure 201, 200a.

If $$W > \frac{D \cdot d}{H + d}$$

a portion of the light backscattered by the nanostructure 201, 200a outside of the illumination cone is not reflected.

According to a possibility illustrated in FIG. 11, the diffusion layer 23 can comprise one single metal nanostructure 201.

The light beams backscattered by the nanostructure 201 then reflected by the reflection layer 40 in the direction of the observer allow to reinforce the non-specular diffusion of the diffuser.

The angular diffusion of the diffuser is moreover perfectly isotropic (case outlined in FIG. 7C).

Figure 12:
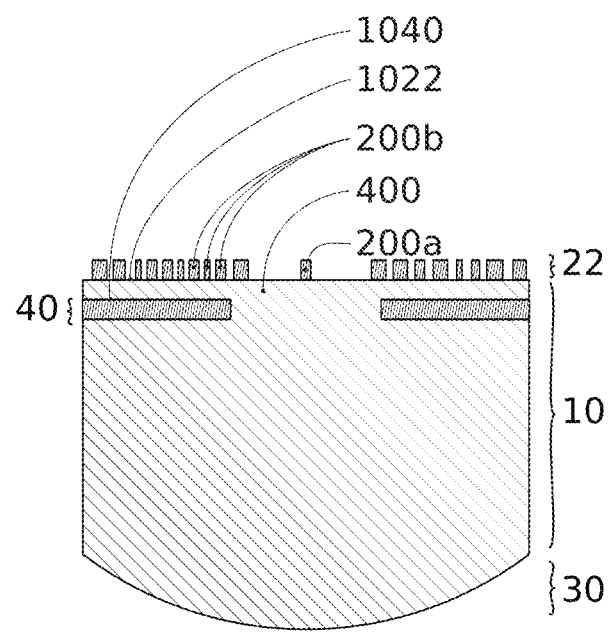
FIG. 12 schematically illustrates, as a transverse cross-section, a diffuser comprising a transmission layer, a focalisation layer, a reflection layer and a diffusion layer with a basis of a plurality of metal nanostructures, according to an embodiment of the present invention.

According to another possibility illustrated in FIG. 12, the diffusion layer 22 can comprise a plurality of metal nanostructures 200a, 200b.

In the latter case, only one or a few nanostructures 200a are illuminated directly by the illumination cone formed by the focalisation layer 30.

The metal nanostructures 200b advantageously allow to favour the extraction, in the direction of the observer, a so-called low-angled portion of the light backscattered by the metal nanostructure(s) 200a at the focalisation point.

This low-angled portion comprises, in particular, the light beams of which the propagation direction forms an angle with the diffusion layer 22 less than the total reflection angle at the level of the interface 1022 between the transmission layer 10 and the diffusion layer 22. During the propagation thereof, these low-angled light beams are successively reflected at the interface 1022, then at the interface 1040 between the transmission layer 10 and the reflection layer

40. These low-angled light beams are therefore trapped within the transmission layer 10 and are not transmitted in the direction of the observer.

Advantageously, the metal nanostructures 200b form singularities at the interface 1022. These singularities favour the extraction of the low-angled light beams, from the transmission layer 10 in the direction of the observer. The total transmission of the diffuser is increased.

The low-angled light beams thus diffused by the nanostructures 200b have diffusion angles relatively greater than the light beams directly diffused by the nanostructure 200a.

The angular diffusion of the diffuser is thus enlarged (case outlined in FIG. 8C).

Below, the diffuser illustrated in FIGS. 7A and 11 is evaluated for non-optimal embodiment or operating conditions.

The diffusion effectiveness is, in particular, evaluated:
for different wavelengths of the incident light, transmitted by the source 1 ("wavelengths" case), then
for a diffuser of which the opening 400 is off-centred opposite the nanostructure 201 ("misalignment" case), then
for a diffuser of which the illumination cone is not normal to the reflection and diffusion layers 40, 23 ("angle of incidence" case).

Wavelengths

The diffuser evaluated below by way of FDTD simulations comprises a transmission layer 10, a focalisation layer 30, a reflection layer 40 and a metal nanostructure-based 201 diffusion layer 23.

The diameter D of the focalisation lens is here equal to 15 μm. The distance d separating the diffusion layer 23 of the reflection layer 40 is here equal to 3 μm. The distance H separating the reflection layer 40 of the focalisation layer 30 is here equal to 12 μm. The diameter of the opening 400 in the reflection layer 40 is here equal to 1.36 μm.

The light transmitted by the source 1 is a flat incident wave.

Figure 13A:
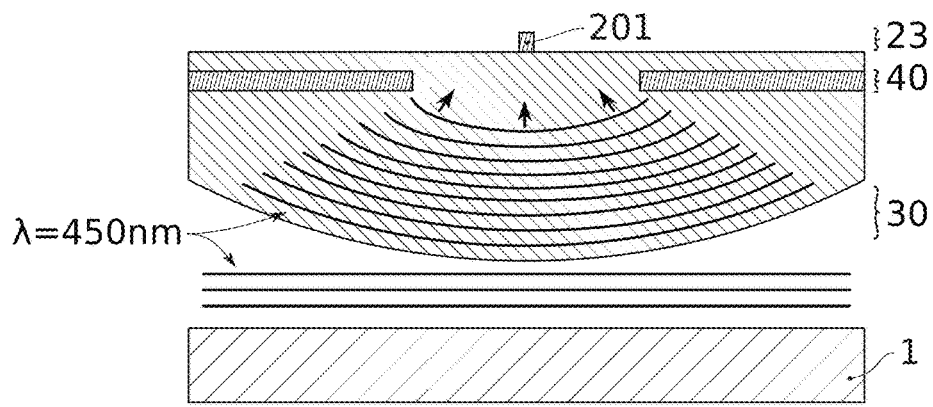
FIG. 13A schematically illustrates a diffuser comprising a transmission layer, a focalisation layer, a reflection layer and a metal nanostructure-based diffusion layer, according to an embodiment of the present invention and illuminated by a light of wavelength $\lambda=450$ nm.
Figure 13B:
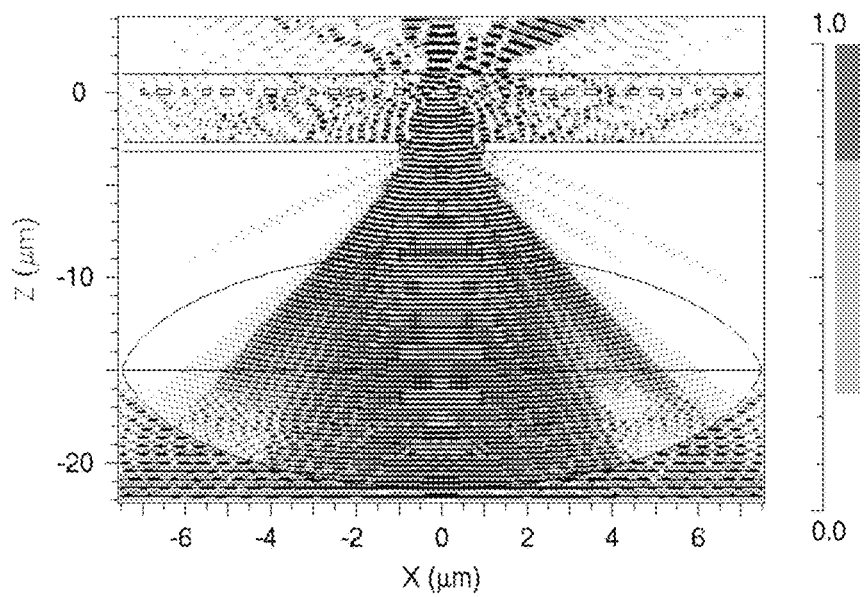
FIG. 13B shows a mapping of the electromagnetic field obtained by simulation for a light transmission of wavelength $\lambda=450$ nm through the diffuser of FIG. 13A.

FIGS. 13A and 13B illustrates a light transmission of wavelength λ=450 nm (FIG. 13B) through such a diffuser (FIG. 13A).

Figure 13C:
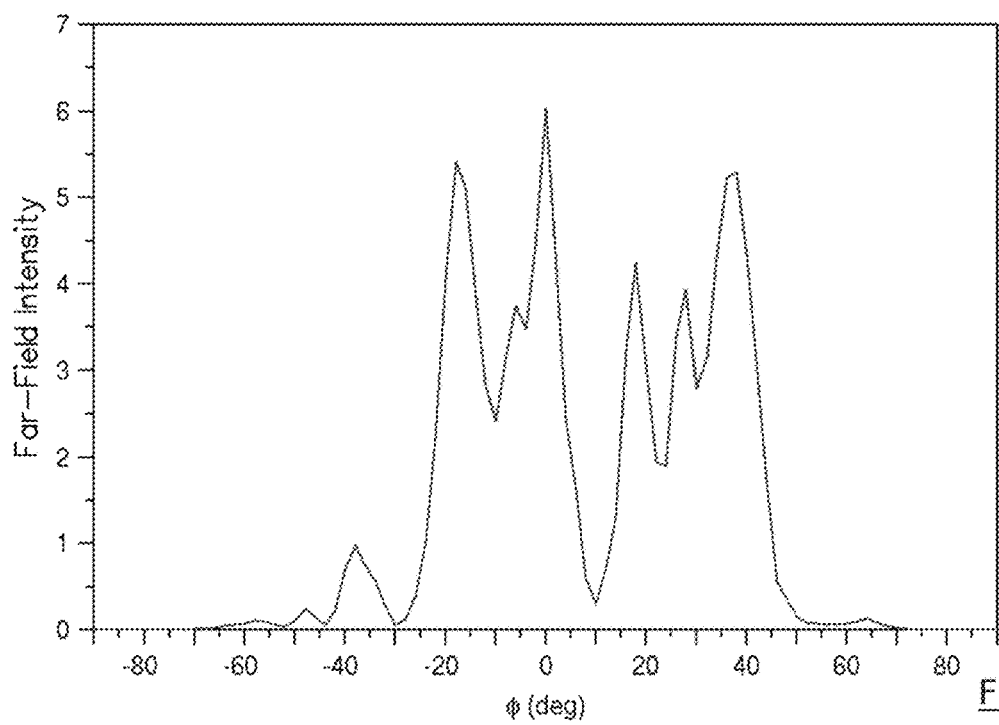
FIG. 13C shows an angular diagram obtained by simulation for a light transmission of wavelength $\lambda=450$ nm through the diffuser of FIG. 13A.

The angular diagram obtained under these embodiment and illumination conditions is shown in FIG. 13C.

Figure 14A:
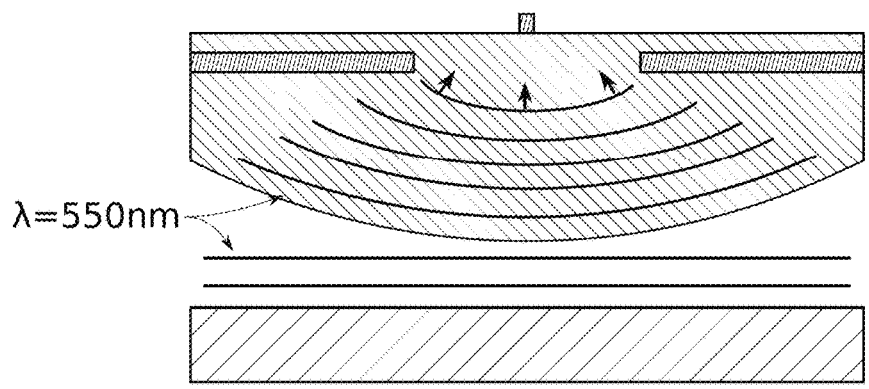
FIG. 14A schematically illustrates a diffuser comprising a transmission layer, a focalisation layer, a reflection layer and a metal nanostructure-based diffusion layer, according to an embodiment of the present invention and illuminated by a light of wavelength $\lambda=550$ nm.
Figure 14B:
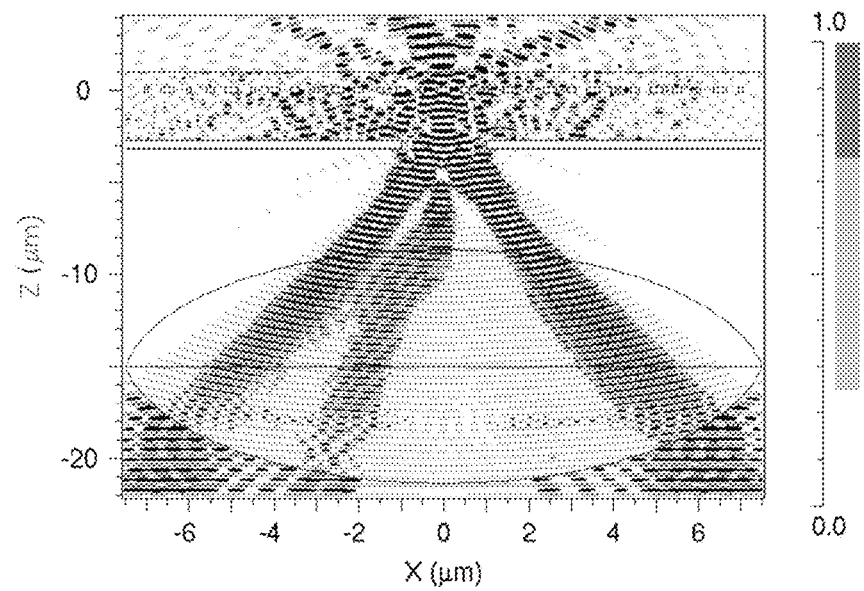
FIG. 14B shows a mapping of the electromagnetic field obtained by simulation for a light transmission of wavelength $\lambda=550$ nm through the diffuser of FIG. 14A.

FIGS. 14A and 14B illustrates a light transmission of wavelength λ=550 nm (FIG. 14B) through such a diffuser (FIG. 14A). The angular diagram obtained under these embodiment and illumination conditions is shown in FIG. 14C.

Figure 15A:
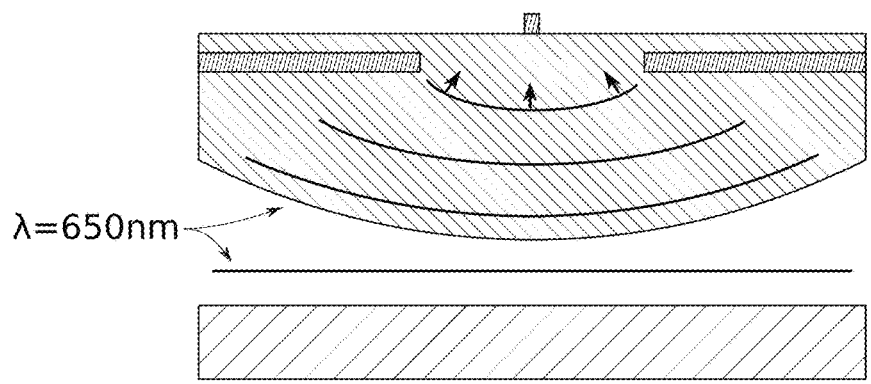
FIG. 15A schematically illustrates a diffuser comprising a transmission layer, a focalisation layer, a reflection layer and a metal nanostructure-based diffusion layer, according to an embodiment of the present invention and illuminated by a light of wavelength $\lambda=650$ nm.
Figure 15B:
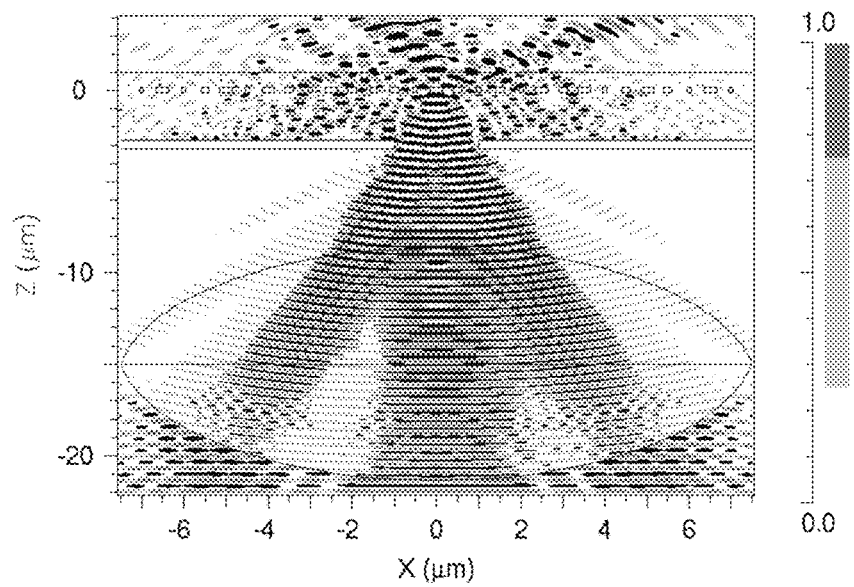
FIG. 15B shows a mapping of the electromagnetic field obtained by simulation for a light transmission of wavelength $\lambda=650$ nm through the diffuser of FIG. 15A.

FIGS. 15A and 15B illustrates a light transmission of wavelength λ=650 nm (FIG. 15B) through such a diffuser (FIG. 15A). The angular diagram obtained under these embodiment and illumination conditions is shown in FIG. 15C.

Figure 14C:
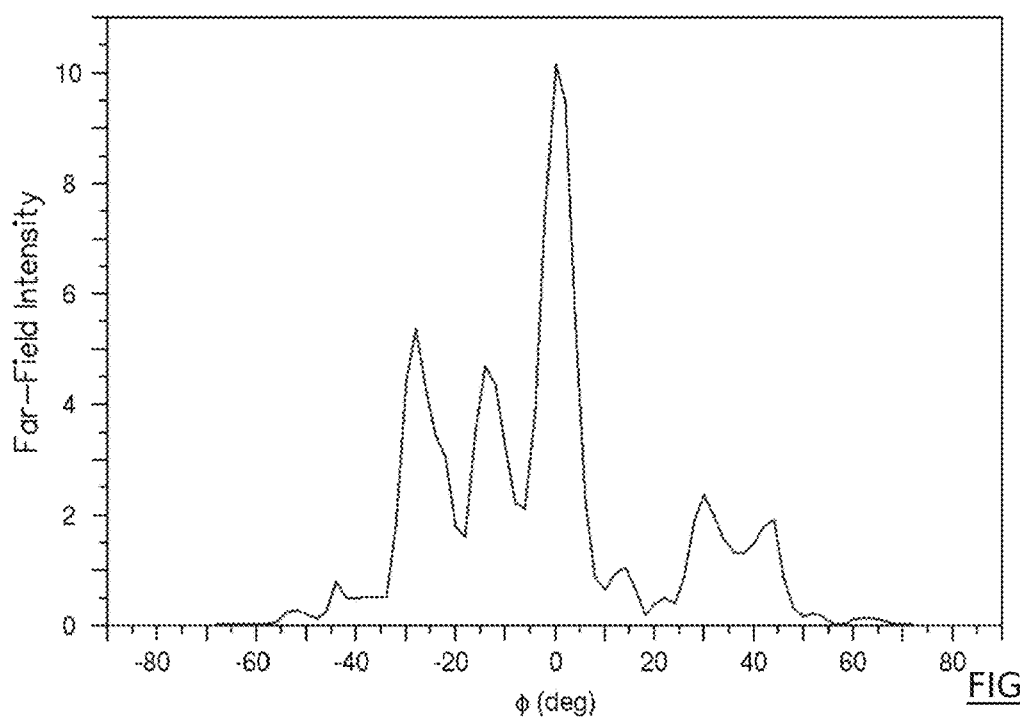
FIG. 14C shows an angular diagram obtained by simulation for a light transmission of wavelength $\lambda=550$ nm through the diffuser of FIG. 14A.
Figure 15C:
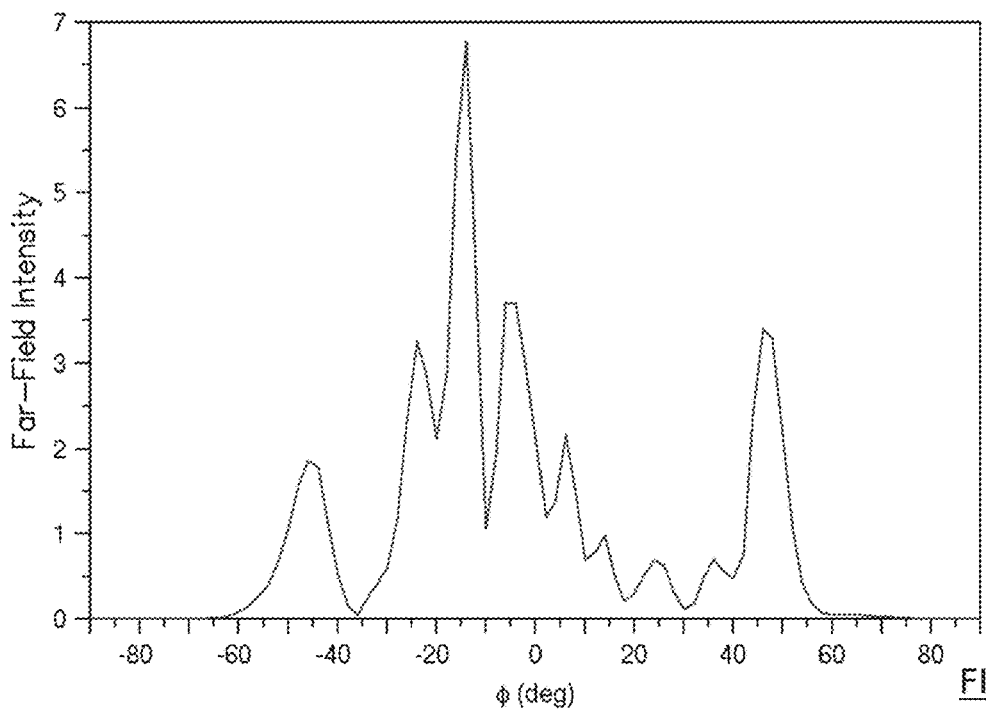
FIG. 15C shows an angular diagram obtained by simulation for a light transmission of wavelength $\lambda=650$ nm through the diffuser of FIG. 15A.

By comparing the angular diffusion diagrams of FIGS. 13C, 14C and 15C, it seems that the transmission level of the diffuser (far-field intensity) is about constant, whatever the wavelength.

The width of the angular diffusion diagrams is also relatively wide and constant, whatever the wavelength.

The variation of wavelength of the light transmitted by the source therefore has a marginal impact on the effectiveness of diffusion of the diffuser, at least one the visible spectrum 450 nm to 650 nm.

This allows to consider a use of this diffuser for pixels of different colours of a display screen.

The observer can thus observe such a display screen in a wide range of observation angles opposite the normal direction to the screen, without perceiving interfering intensity fluctuations.

Misalignment

The diffuser evaluated in this section has a misalignment X between the nanostructure 201 and the centre of the opening 400, parallel to the diffusion layer. This misalignment X is illustrated in FIG. 16A (nanostructure aligned with the opening, taken as reference) and 16B (nanostructure misaligned with the opening).

This misalignment X can be due, for example, to a badly controlled manufacturing technology step. The opening 400 has a diameter W.

In such a case, the transmission T of light by the diffuser is given by the ratio:

$$T = e^{-\frac{4X^2}{W^2}} = e^{-\frac{4X^2(H+d)^2}{D^2 d^2}} \qquad \text{[Math. 2]}$$

FIG. 16C shows a transmission diagram T according to the misalignment X, for the following parameters:

The diameter D of the focalisation lens is here equal to 15 μm. The distance d separating the diffusion layer 23 of the reflection layer 40 is here equal to 3 μm. The distance H separating the reflection layer 40 from the focalisation layer 30 is here equal to 12 μm. The diameter of the opening 400 in the reflection layer 40 is here equal to 1.36 μm.

Under these conditions, a misalignment X less than about ±1 μm allows to conserve more than 70% of the light transmitted by the diffuser.

Such a tolerance of the order of ±1 μm is broadly greater than the precision of positioning the different layers or levels relative to one another in standard microelectronic technologies.

FIG. 16D shows a transmission diagram T according to the misalignment X, for the following parameters:

The diameter D of the focalisation lens is here equal to 15 μm. The distance d separating the diffusion layer 23 from the reflection layer 40 is here equal to 7 μm. The distance H separating the reflection layer 40 from the focalisation layer 30 is here equal to 8 μm. The diameter of the opening 400 in the reflection layer 40 is here equal to 7 μm.

Under these conditions, a misalignment X less than about ±2 μm allows to conserve more than 70% of the light transmitted by the diffuser.

Such a tolerance of the order of ±2 μm is broadly greater than the precision of positioning of the different layers or levels relative to one another in standard microelectronic technologies.

These embodiment conditions are even more favourable to the robustness of the diffuser against an alignment defect.

Angle of Incidence

The diffuser evaluated in this section is illuminated by an illumination cone having an angle of incidence β with respect to a direction normal to the reflection layer 40 of the diffuser.

The centre of the illumination cone, at the intersection with the opening 400, is offset by a distance X opposite the centre of the opening 400 aligned with the nanostructure 201.

Figure 17A:
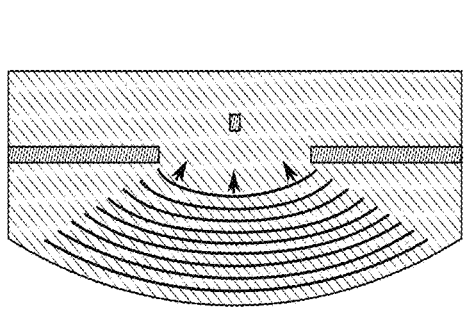
FIG. 17A schematically illustrates a diffuser comprising a transmission layer, a focalisation layer, a reflection layer and a metal nanostructure-based diffusion layer, according to an embodiment of the present invention having an ideal configuration and illuminated in an ideal manner.
Figure 17B:
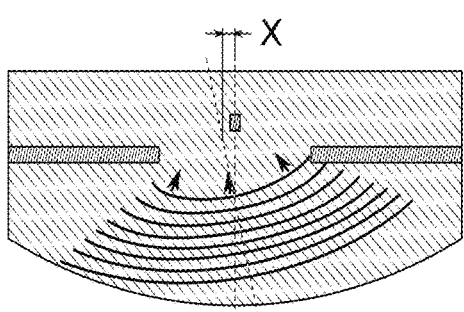
FIG. 17B schematically illustrates a diffuser comprising a transmission layer, a focalisation layer, a reflection layer and a metal nanostructure-based diffusion layer, according to an embodiment of the present invention having an ideal configuration and illuminated in a non-ideal manner.

This illumination situation is illustrated in FIGS. 17A (normal angle of incidence, taken as reference) and 17B (angle of incidence β).

This angle of incidence $\beta$ can be due, for example, to the divergence of the transmission cone of the source 1, or to an arrangement of the diffuser opposite the badly controlled source. The opening 400 has a diameter W.

In such a case, the transmission T of light by the diffuser is given by the ratio:

$$T = e^{-\frac{4X^2}{W^2}} = e^{-\frac{4H^2(H+d)^2}{D^2 d^2}\tan^2 \beta} \quad \text{[Math. 3]}$$

Figure 17C:
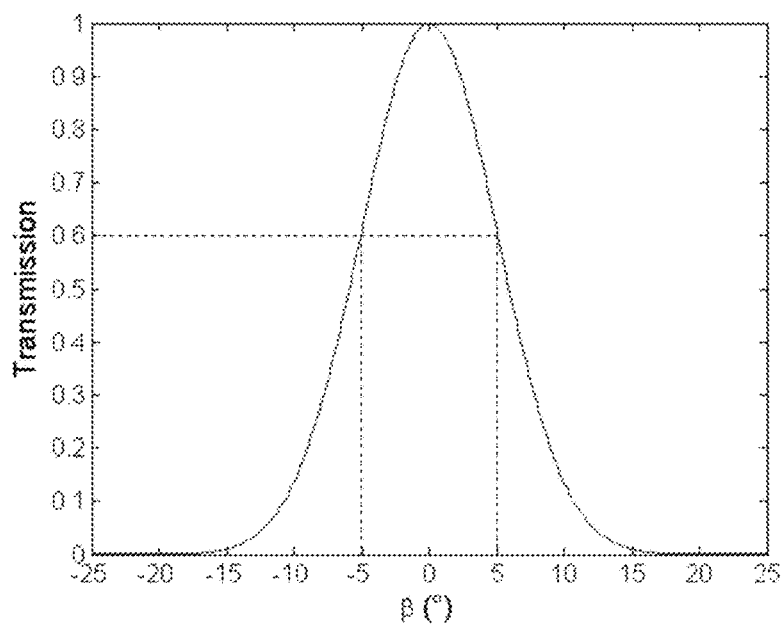
FIG. 17C shows an angular diagram obtained by simulation for a light transmission through the diffuser of FIG. 17B having a distance $d=3$ µm between the reflection layer and the diffusion layer and a distance $H=12$ µm between the reflection layer and the focalisation layer.

FIG. 17C shows a transmission diagram T according to the angle of incidence $\beta$, for the following parameters:

The diameter D of the focalisation lens is here equal to 15 µm. The distance d separating the diffusion layer 23 of the reflection layer 40 is here equal to 3 µm. The distance H separating the reflection layer 40 of the focalisation layer 30 is here equal to 12 µm. The diameter of the opening 400 in the reflection layer 40 is here equal to 1.36 µm.

Under these conditions, an angle of incidence $\beta$ less than about ±5° allows to conserve more than 60% of the light transmitted by the diffuser.

Such a tolerance of the order of ±5° is broadly greater than the assembly precision in standard microelectronic technologies.

Figure 17D:
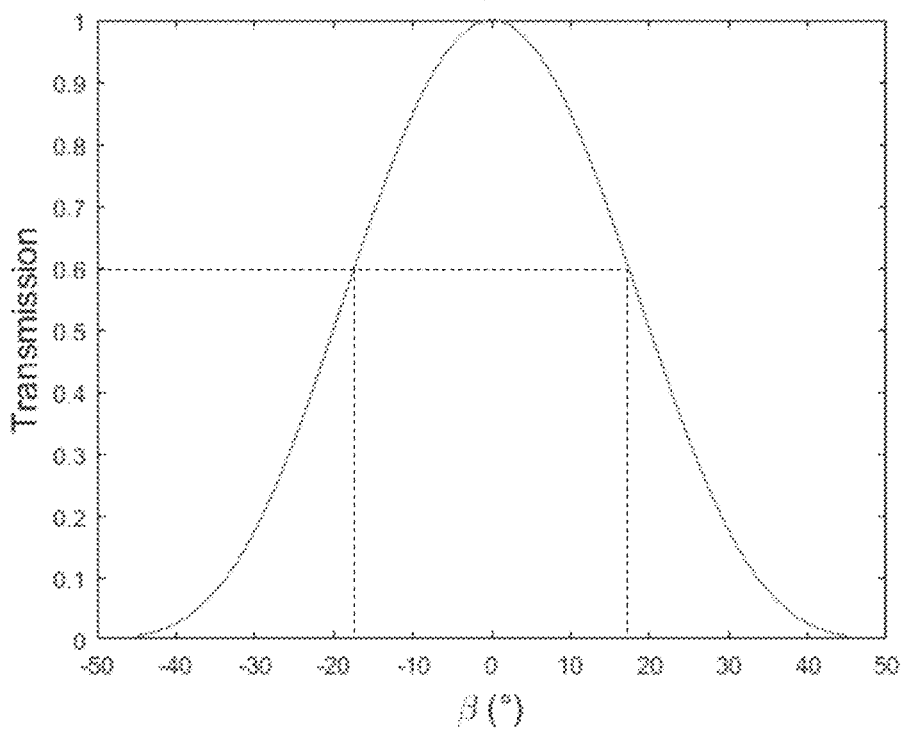
FIG. 17D shows an angular diagram obtained by simulation for a light transmission through the diffuser of FIG. 17B having a distance $d=7$ µm between the reflection layer and the diffusion layer and a distance $H=8$ µm between the reflection layer and the focalisation layer.

FIG. 17D shows a transmission diagram T according to the angle of incidence $\beta$, for the following parameters:

The diameter D of the focalisation lens is here equal to 15 µm. The distance d separating the diffusion layer 23 of the reflection layer 40 is here equal to 7 µm. The distance H separating the reflection layer 40 of the focalisation layer 30 is here equal to 8 µm. The diameter of the opening 400 in the reflection layer 40 is here equal to 7 µm.

Under these conditions, an angle of incidence $\beta$ less than about ±20° allows to conserve more than 60% of the light transmitted by the diffuser.

The sensitivity of the diffuser to the angle of incidence of the transmission cone is here reduced with respect to the preceding case illustrated by FIG. 17C.

These embodiment conditions are even more favourable to the effectiveness of the diffuser regarding the illumination conditions.

A standard GaN LED transmits light in a transmission cone having a maximum angle of ±25°. Moreover, the transmission of the LED in this angular range is Lambertian and favours the normal angles of incidence.

A diffuser having such parameters, in particular with H close to d, is therefore perfectly adapted for the diffusion of the light transmitted by a standard GaN LED.

Examples of Embodiment Methods

The present invention also relates to a method for manufacturing a diffuser such as described through the preceding examples of embodiments.

Advantageously, the standard microelectronic manufacturing means can be implemented.

Figure 18A:
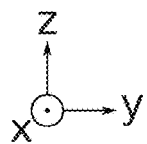
FIGS. 18A to 18D schematically illustrate steps of a method for manufacturing a diffuser according to an embodiment of the invention.
Figure 18A:
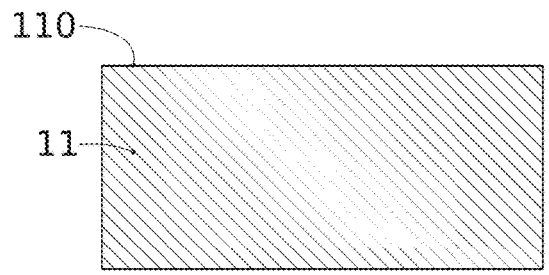
Figure 18B:
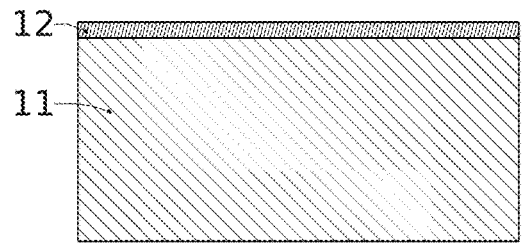

On a face 110 of a transparent substrate 11 in at least one portion of the visible range and preferably in the whole visible range (FIG. 18A), for example made of glass, a metal layer 12 is deposited (FIG. 18B).

The metal layer 12 preferably has a thickness of the order of 100 nm to 500 nm.

This metal layer 12 can be made of aluminium. Such a layer is advantageously compatible with CMOS technologies.

The aluminium layer is then structured in a known manner by lithograph (UV or electron beam) and etching (RIE, for example).

Figure 18C:
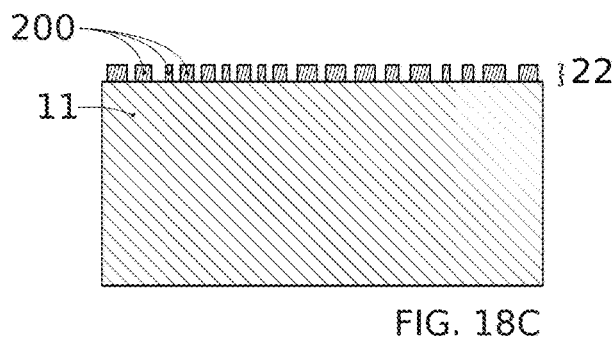

This allows to form nanostructures 200 of varied sizes, distributed in a disorganised manner on the substrate 11 (FIG. 18C). The diffusion layer 22 of the diffuser is thus formed, simply and made of a minimum number of technological steps.

Furthermore, aluminium has low losses by absorption. The total transmission of an aluminium nanostructure-based diffuser is optimised.

Optionally, a planarization step can also be carried out.

Figure 18D:
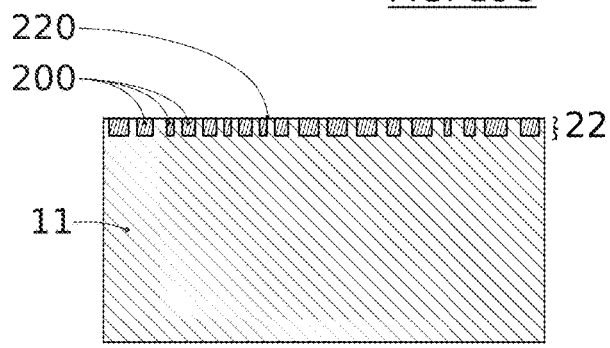

A transparent layer, for example made of silica, can be deposited around nanostructures 200, in particular between the nanostructures 200, so as to encapsulate them (FIG. 18D). Such a composite diffusion layer 22 has an improved mechanical strength.

A polishing, for example by CMP (chemical mechanical polishing) can also be carried out, in particular so as to expose the top of the nanostructures 200 of the composite diffusion layer 22. This allows to obtain a composite diffusion layer 22 having a planarized face 220 having a surface condition compatible with optional subsequent technological steps.

Figure 19A:
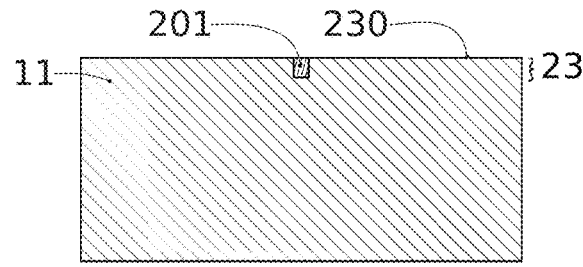
FIGS. 19A to 19C schematically illustrate steps of a method for manufacturing a diffuser comprising a metal nanostructure-based diffusion layer, a transmission layer and a focalisation layer comprising a microlens, according to an embodiment of the invention.
Figure 19B:
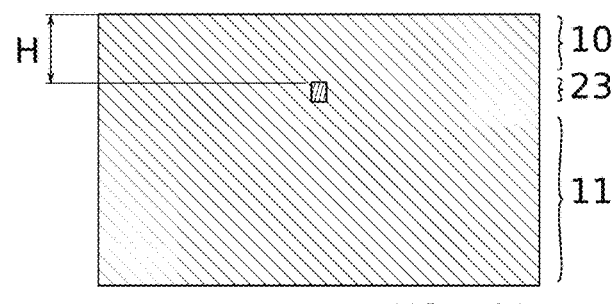
Figure 19C:
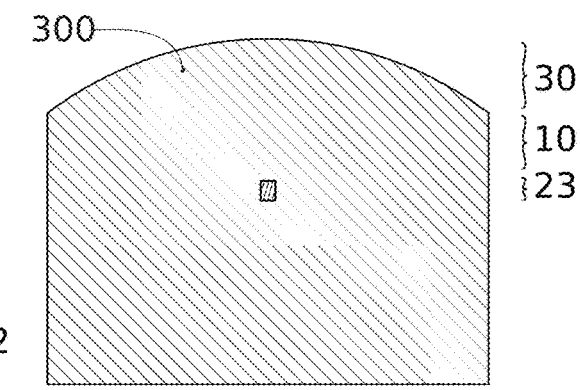

FIGS. 19A-19C illustrate the embodiment of a diffuser comprising a metal nanostructure 201 and a refractive microlens 300.

A diffusion layer 23 comprising one single metal nanostructure 201 is made by lithography/etching and planarized, as above (FIG. 19A).

A silica transmission layer 10 is deposited on the planarized face 230 of the diffusion layer 23, over a thickness H' (FIG. 19B).

A silica microlens 300 is then formed on the transmission layer 10 (FIG. 19C).

FIGS. 20A to 20G illustrate more specifically, examples of forming such a microlens 300.

These examples relate to an embodiment of the diffuser comprising a diffusion layer 22 with the basis of a plurality of nanostructures, a transmission layer 10, a reflection layer 40, and a focalisation layer 30 comprising a microlens 300. These examples of forming a microlens 300 can however be adapted mutatis mutandis to other embodiments of the diffuser, in particular to a diffuser comprising a diffusion layer 23 with the basis of one single nanostructure and/or to a diffuser without reflection layer 40.

In order to produce a silica microlens 300 on the face 100 of the transmission layer 10 (FIG. 20A), a silica layer 301 of thickness corresponding to the height of the microlens can be deposited beforehand on this face 100. The focalisation layer is then formed from this silica layer 301.

Figure 20A:
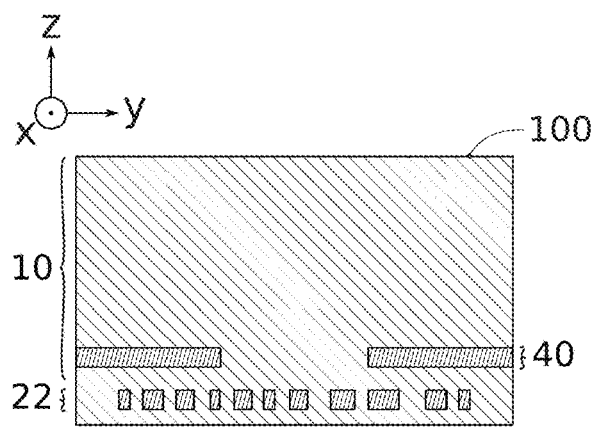
FIGS. 20A to 20G schematically illustrate steps of forming a microlens for a diffuser comprising a diffusion layer with the basis of a plurality of metal nanostructures, a transmission layer, a reflection layer and a focalisation layer comprising the microlens, according to an embodiment of the invention.
Figure 20B:
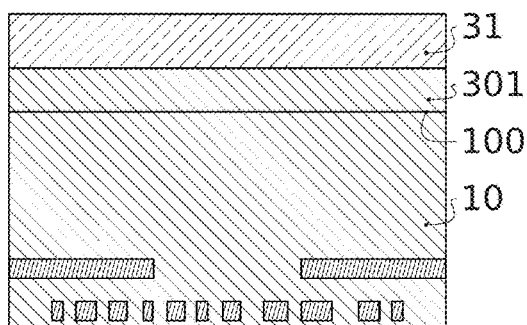
Figure 20C:
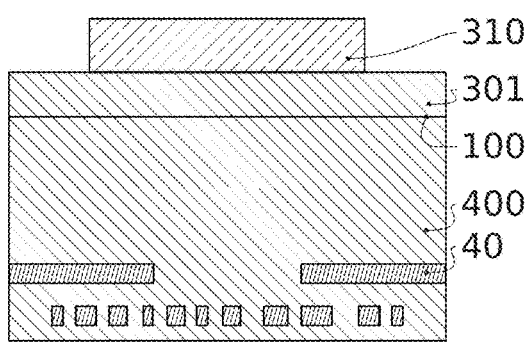
Figure 20D:
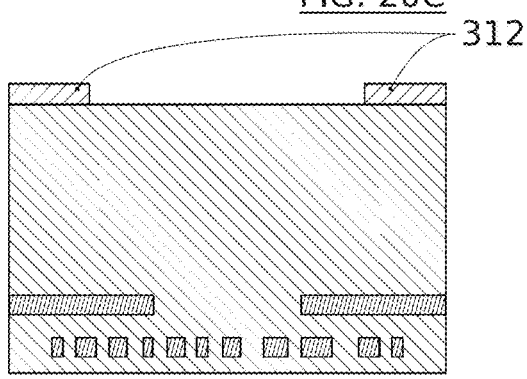

According to an example, a photosensitive resin layer 31 of thickness about equal to the height of the microlens to be produced is then deposited on the silica layer 301 (FIG. 20B). This photosensitive resin 31 is intended to form a microlens pattern, which will then be transferred in the underlying silica layer 301.

The thickness of resin to be deposited can vary according to the etching conditions used for the transfer of the microlens pattern in the silica layer 301.

The photosensitive resin layer 31 is first structured by lithography (FIG. 20C) so as to obtain a portion 310 of resin centred opposite the opening 400 of the reflection layer 40. This portion 310 has a width about equal to that of the microlens 300.

Figure 20E:
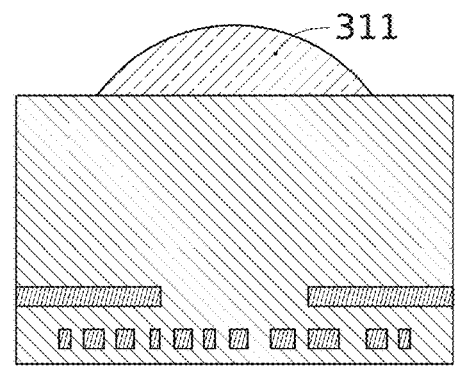

A thermal treatment of this portion 310 can then allow to generate the microlens pattern 311 (FIG. 20E). Such a thermal treatment can be adapted according to the properties of surface viscosity and/or tension of the photosensitive resin.

An anisotropic etching, along a direction normal to the silica layer 301, is then carried out so as to transfer this microlens pattern 311 in the silica layer 301.

Figure 20F:
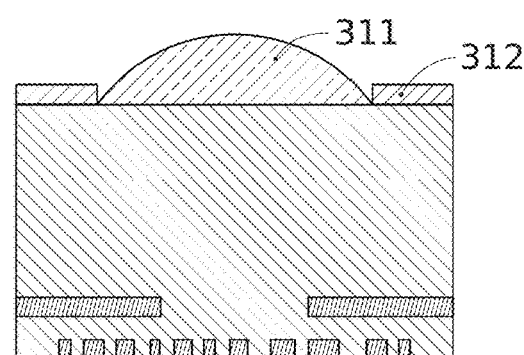
Figure 20G:
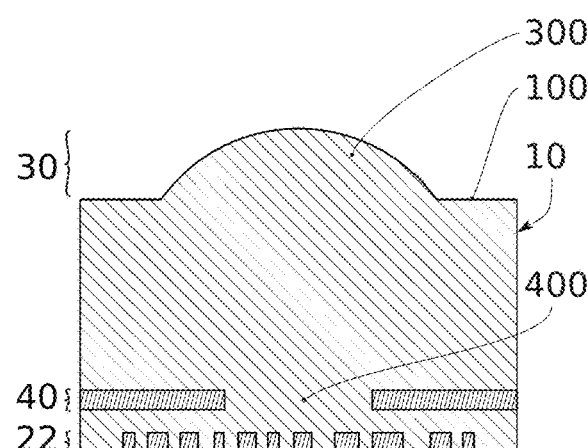

The microlens 300 is thus formed in the silica layer 301 (FIG. 20G).

This etching can advantageously have a selectivity of 1:1 between the resin and the silica. The pattern 311 is subsequently transferred directly into the silica layer 301. The initial curvature of the resin pattern 311 can thus be loyally reproduced on the microlens 300. The height of the microlens 300 is substantially the same as the height of the pattern 311.

A silicon nitride (SiN) microlens 300 can also be produced according to the same principle, from a SiN layer 301. According to the index contrast sought between the microlens and the surrounding medium, other materials can be used to form the microlens 300.

According to another example, a pattern 311 can be formed by localised resin dispense on a hydrophilic surface 302.

According to this alternative, a mask 312 is formed on the surface 302 of the silica layer 301 (FIG. 20D) before the dispense of the resin. This mask 312 allows to confine the spreading of the resin at the level of the pattern 311.

The thickness of the mask 312 is preferably at least twice less, and preferably at least five times less than the height of the pattern 311. This allows to avoid capillary effects at the edge of the pattern 311, likely to modify the curvature of the pattern 311.

In this example, the surface 302 is functionalised so as to make it hydrophilic. This allows to modify the surface tension between the surface 302 and the resin, so as to obtain the desired curvature for the pattern 311 (FIG. 20F).

The pattern 311 is then transferred by etching in the silica layer 301, as above.

The microlens 300 is thus formed in the silica layer 301 (FIG. 20G).

FIGS. 21A to 21F illustrates the embodiment of a diffuser comprising at least one metal nanostructure, a reflection layer open facing the at least one nanostructure, and a refractive microlens conjugated at the at least one nanostructure.

Figure 21A:
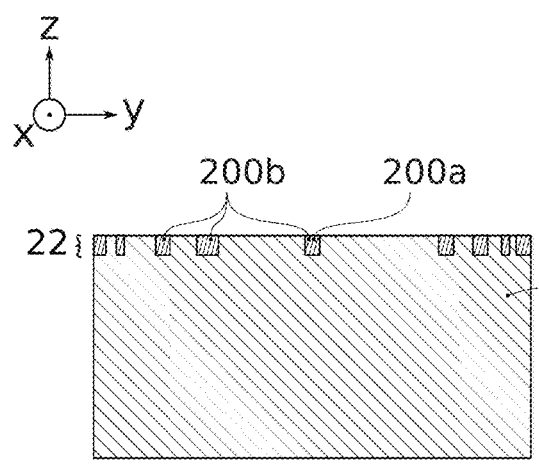
FIGS. 21A to 21F schematically illustrate steps of a method for manufacturing a diffuser comprising a diffusion layer with the basis of a plurality of metal nanostructures, a transmission layer, a reflection layer and a focalisation layer comprising a microlens, according to an embodiment of the invention.

A diffusion layer 22 comprising at least one nanostructure 200a or a plurality of metal nanostructures 200a, 200b is made on a transparent substrate 11 by lithography/etching and planarized, as above (FIG. 21A).

Figure 21D:
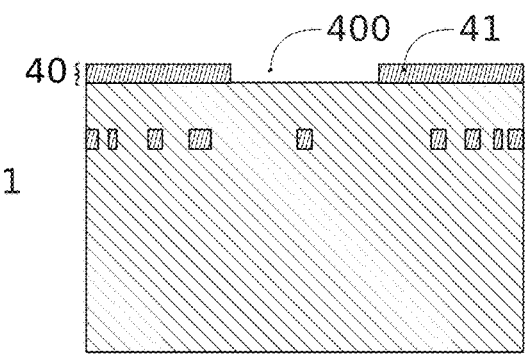
Figure 21B:
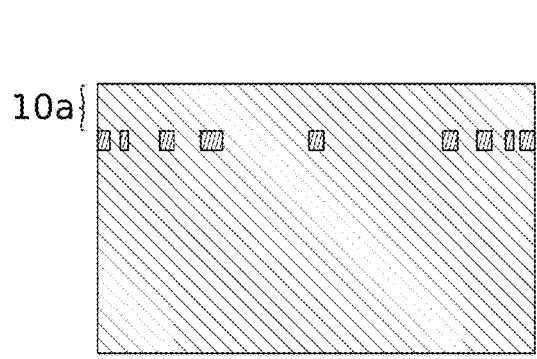

A first portion 10a of the transmission silica layer 10 is deposited on the planarized face of the diffusion layer 22, on a thickness d (FIG. 21B).

A metal layer 41, for example made of aluminium, is deposited on the first portion 10a of the transmission layer 10. This metal layer 41 preferably has a thickness comprised between 50 nm and 300 nm.

An opening 400 aligned on the at least one nanostructure 200a is formed in the metal layer 41 by lithography and etching (FIG. 21D). This opening 400 has a diameter W.

The reflection layer 40 is thus formed.

Figure 21E:
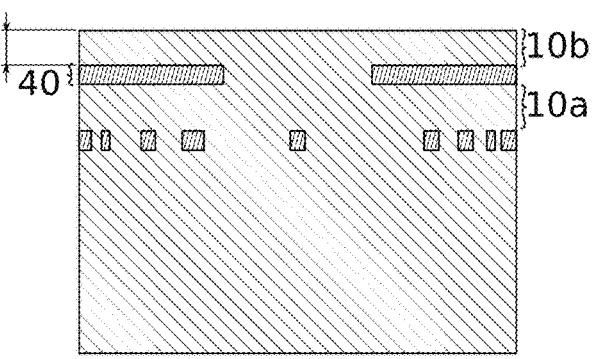
Figure 21C:
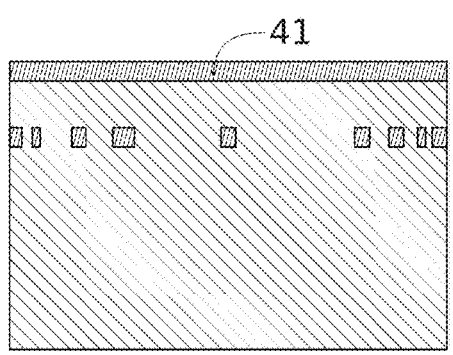

A silica deposition is then carried out so as to fill the opening 400 and to form a second portion 10b of the transmission layer 10 (FIG. 21E).

This second portion 10b has a thickness H.

A transmission layer 10 comprising within it, a reflection layer 40 is thus formed.

Figure 21F:
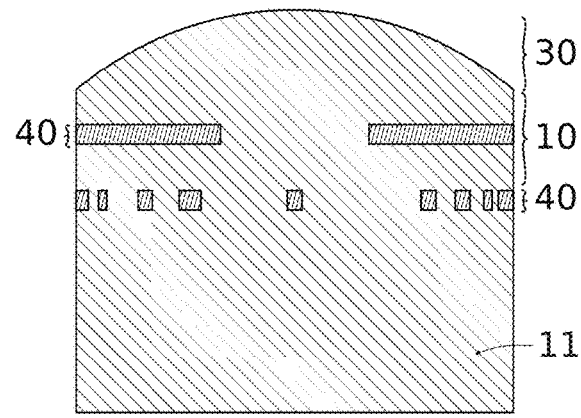

A focalisation layer 30 comprising a microlens 300 is then made as above (FIG. 21F).

FIGS. 22A to 22E illustrate the embodiment of a diffuser comprising at least one metal nanostructure 200a, a reflection layer 40 open facing the at least one nanostructure 200a, and a Fresnel lens 303 conjugated at the at least one nanostructure 200a.

Figure 22A:
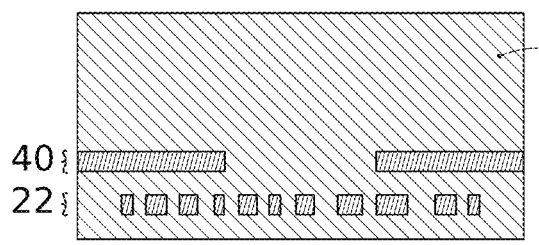
FIGS. 22A to 22E schematically illustrate steps of forming a Fresnel lens for a diffuser comprising a diffusion layer with the basis of a plurality of metal nanostructures, a transmission layer, a reflection layer and a focalisation layer comprising the Fresnel lens, according to an embodiment of the invention.
Figure 22A:
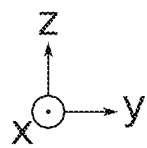

As above, a diffusion layer 22 and a transmission layer 10 comprising within it, a reflection layer 40 are formed (FIG. 22A).

A metal layer 302, for example made of aluminium, is deposited on the exposed face of the transmission layer 10. This metal layer 302 preferably has a thickness comprised between 50 nm and 300 nm (FIG. 22B).

Figure 22D:
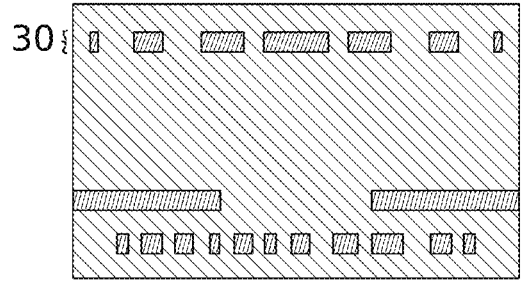
Figure 22D:
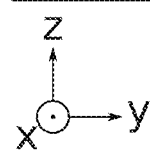
Figure 22B:
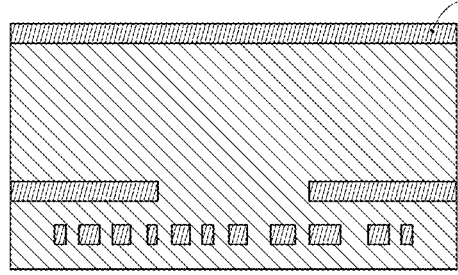
Figure 22B:
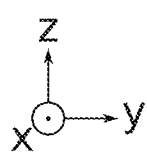
Figure 22C:
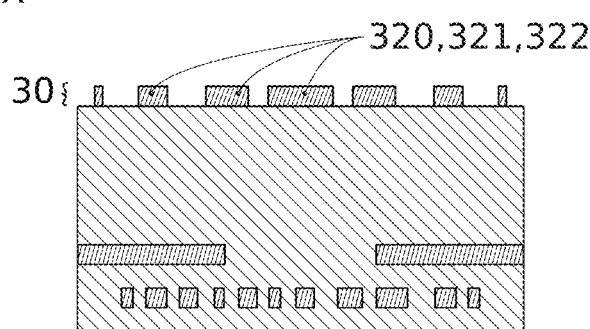
Figure 22C:
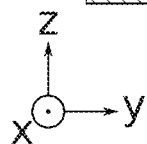

Fresnel lens patterns 320, 321, 322 are formed in this metal layer 302, preferably by lithography/etching, so as to form the focalisation layer 30 (FIG. 22C).

Optionally, a planarization step comprising a deposition of silica between the patterns 320, 321, 322 and/or a polishing, can also be carried out (FIG. 22D). The focalisation layer 30 is thus protected and has an improved mechanical strength.

Figure 22E:
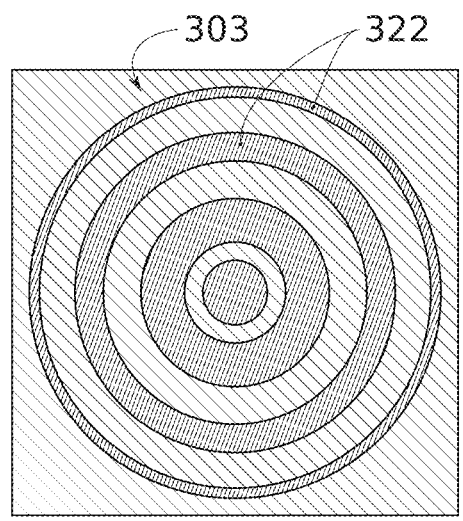
Figure 22E:
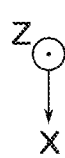

Such a Fresnel lens 303 comprising, for example, patterns 322 of concentric rings of widths decreasing from the centre is illustrated in FIG. 22E.

Ring widths and spaces between rings are selected so as to obtain the desired focal distance, which corresponds substantially to the thickness H+d of the transmission layer 10.

The Fresnel lens can therefore be advantageously produced by standard planar microelectronic technologies (deposition, lithography, etching).

Such a focalisation layer 30 is simple to produce.

Example of a System

The present invention also relates to a system associating at least one light source, preferably a plurality of point light sources, with a plurality of diffusers such as described through preceding examples of embodiments. Such a system is described below in reference to FIGS. 23 and 24.

Such a system comprises a plurality of diffusers 3 adjacent to one another. These diffusers 3 extend along a plane parallel to the main extension plane xy. This plurality of diffusers 3 can be made by standard planar microelectronic technologies, according to the architectures and methods described above.

Figure 23:
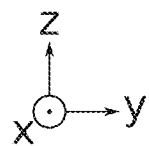
FIG. 23 shows an arrangement of a plurality of diffusers according to an embodiment of the invention.
Figure 23:
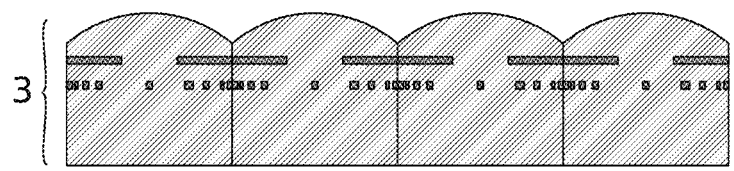

This plurality of diffusers 3 can, for example, comprise diffusers each comprising a transparent support 11, a transmission layer 10, a reflection layer 40, a diffusion layer 22 with the basis of at least one metal nanostructure, and a focalisation layer 30 comprising a refractive microlens (FIG. 23).

According to a non-illustrated possibility, the refractive microlenses can be made of SiN and protected by a planarized silica layer.

Figure 24:
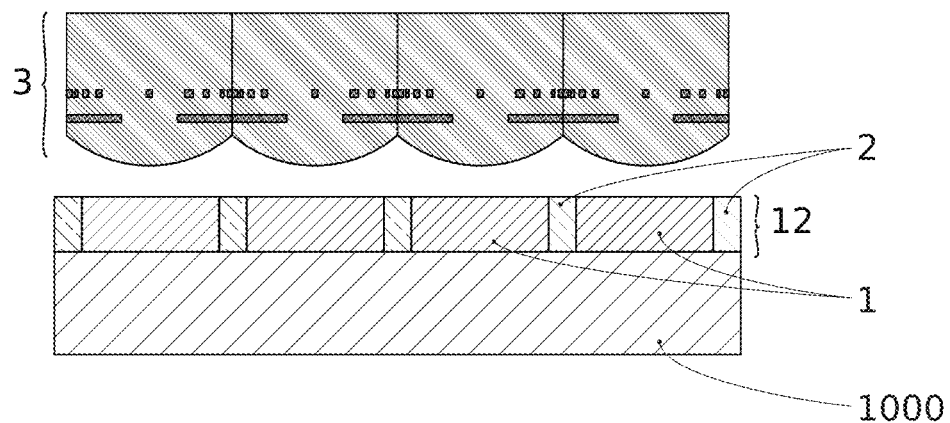
FIG. 24 shows a system comprising a plurality of diffusers arranged with a plurality of LEDs, according to an embodiment of the invention.

The plurality of diffusers 3 can then be arranged facing point light sources 1, for example LEDs (FIG. 24).

The LEDs 1 can be separated from one another by electrical insulation and/or injection structures 2.

The LEDs 1 are preferably controlled independently from one another by a control array 1000, integrating, for example, CMOS (complementary metal oxide semiconductor) components.

These LEDs 1 form, for example, pixels or subpixels of a display screen.

The assembly between the plurality of diffusers 3 and the plurality of point sources 12 can be done by conventional coupling with alignment, for example using a so-called "die-to-wafer" hybridisation machine. The cohesion of the assembly is ensured, for example, by a glue of which the refraction index does not disrupt the operation of the lenses of the focalisation layer. This glue can be, for example, a UV glue.

According to a possibility, spacers can be disposed between the plurality of diffusers 3 and the plurality of point sources 12, so as to fix the separation distance between these two portions 3, 12 facing one another.

The system according to the invention associating a plurality of point light sources has an advantageous application in the embodiment of three-dimensional (3D) display screens.

Such 3D display screens are designed so as to display slightly different images according to the view angle. In particular, to give a three-dimensional perception to an observer O, each of their two eyes O1, O2 must see two slightly different images, for example, in terms of luminosity and/or colour (FIG. 25).

Figure 25:
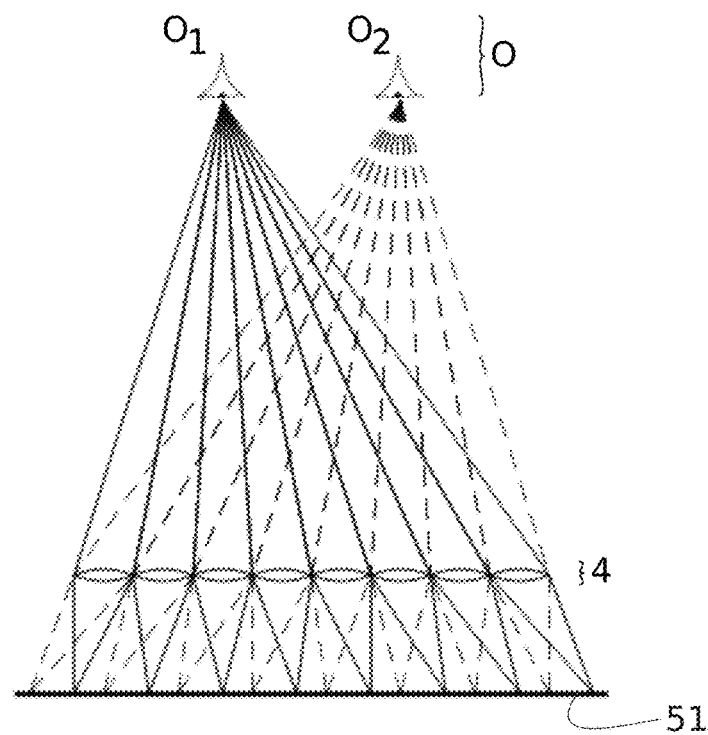
FIG. 25 shows a system configured for a 3D display comprising a high-resolution screen associated with a microlens array.

In a known manner, a 3D screen can be made by combining a microlens array 4 and a very high-resolution screen 51, such as illustrated in FIG. 25. In such a configuration, the observer O sees the high-resolution screen 51 through the microlens array 4. In particular, the first eye of the observer O1 sees through the microlens array, a first series of small zones of the high-resolution screen, forming a first image. The second eye of the observer O2 sees through the microlens array, a second series of small zones of the high-resolution screen, forming a second image. These first and second series are intertwined within the high-resolution screen 51.

Such that the observer O can be placed arbitrarily in a given position in front of the 3D screen, the system generates different images for a multitude of viewpoints situated to the side of one another. These viewpoints are commonly called "views". At a given position with respect to the 3D screen, the eyes O1, O2 of the observer select two different views which, by combining them, give a three-dimensional perception to the observer. When they move their head with respect to the 3D screen, this selection changes, which also increases the 3D perception.

In practice, the small zones of the different series correspond to pixels of the very high-resolution screen 51. These pixels form point light sources. They can be constituted by one or more LEDs 1, for example. The number of pixels of the very high-resolution screen is, in the case of an application to the 3D display produces it from the number of microlenses 4 (corresponding to the nominal resolution of the 3D screen perceived by the observer) by the number of views (corresponding to the possible placements of the observer regarding the 3D screen). For one same nominal resolution, the number of pixels necessary to produce a 3D screen is therefore a lot greater than that of a 2D screen, due to the number of views. Such a system therefore requires to use an internal very high-resolution screen 51, to ultimately obtain the desired nominal resolution in 3D display. A very high-resolution screen 51 typically has a pixel density greater than or equal to 500 ppi (pixels per inch), and or a pixel pitch less than or equal to 50 µm. A very high-resolution screen 51 typically has a number of pixels greater than or equal to 10 Mp (megapixels, that is $10^6$ pixels).

Figure 26:
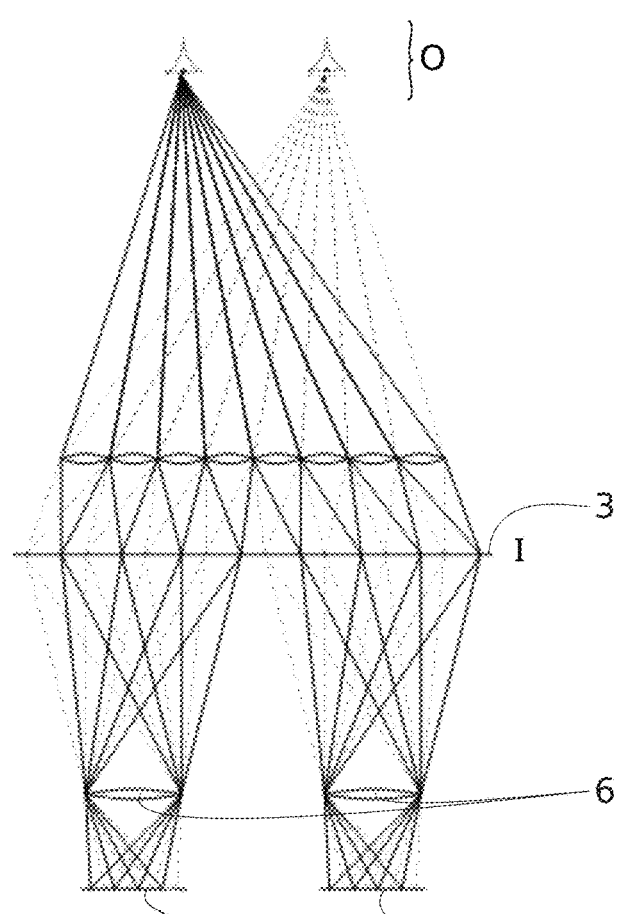
FIG. 26 shows a system configured for a 3D display comprising a plurality of micro-screens associated with a plurality of projection systems and with at least one diffuser, and a microlens array.

This internal very high-resolution screen 51 intertwining a plurality of images associated with the number of desired views can be done or replaced by a plurality of internal micro-screens 52 each diffusing a portion of the images required. In this case, each of the micro-screens 52 is associated with a projection system 6. FIG. 26 illustrates such a system associating micro-screens 52 and projection systems 6. For reasons of clarity, only two micro-screens 52 and two projection systems 6 are illustrated in this FIG. 26.

Such that the light beams coming from the edges of a micro-screen 52 are directed in the direction of the observer O, it is necessary to place a diffuser 3 in the image plane I conjugated at the plane wherein the micro-screen 52 is located.

Such a diffuser 3 must be effective to the scale of the pixels of the very high-resolution screen 51 or pixels of the plurality of the micro-screens 52. These pixels typically have a size of about 15 µm. The diffuser 3 claimed by the present invention advantageously allows to obtain the effectiveness required in the scope of this application for the 3D display.

Subsequently, a system according to the invention comprising:
  a very high-resolution screen 51 constituted of a plurality of micro-screens 52 each comprising a plurality of pixels,
  a plurality of projection systems 6 associated with the plurality of micro-screens 52,
  a plurality of diffusers 3 such as described by the present invention, each diffuser 3 being associated with each pixel of the pluralities of pixels of the micro-screens 52, and
  a microlens array 4,
  is particularly advantageous for the 3D display.

A non-limiting example of sizing of such a system is described below.

For a 3D screen size of 195 mm×150 mm of diagonal 246 mm (9.6 inches) displaying a resolution of 1300×1000, the pitch perceived by the user is 150 µm (which corresponds to the size of a microlens 4 of the microlens array). To obtain 10×10 views, the very high-resolution screen 51 must thus have 13000×10000 pixels, with a pitch of 15 µm. Each pixel thus has a size of about 15 µm.

The very high-resolution screen 51 can be made, in practice, by assembling 5×5 micro-screens 52, each having 2600×2000 pixels. Such micro-screens 52 are, for example, commercialised by the company microOLED.

Figure 27:
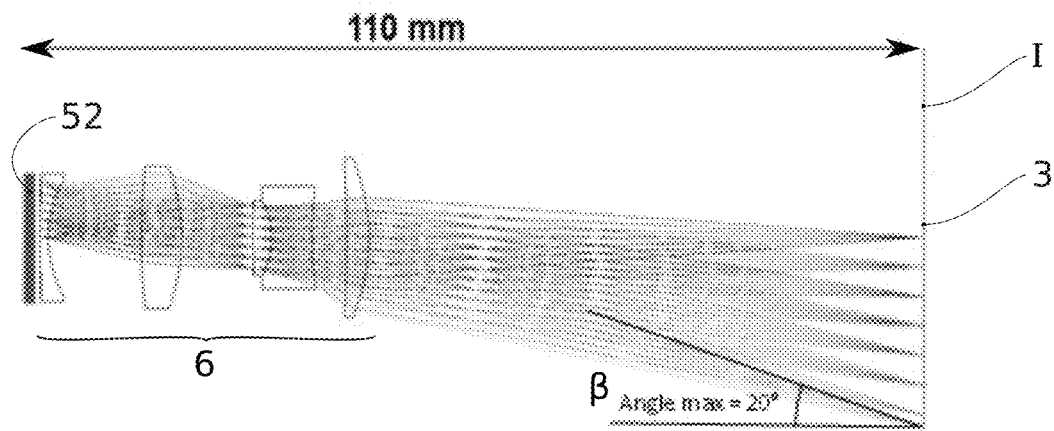
FIG. 27 shows a projection system of the 3D display system illustrated in FIG. 26, according to an embodiment.

The projection system 6 can be made according to the optical design illustrated in FIG. 27. It allows, for example to form an image of the micro-screen 52 on an image plane I situated at 110 mm from the micro-screen 52. The maximum angle of incidence β is, in this case, about 20° with respect to the normal to the image plane I. Such as shown above, the diffuser 3 according to the invention can effectively transmit an incident light in a transmission cone having such an angle of incidence β of the order of 20°.

The image formed on the image plane I is thus diffused by the diffusers 3 then focused by the microlens array 4.

Figure 28:
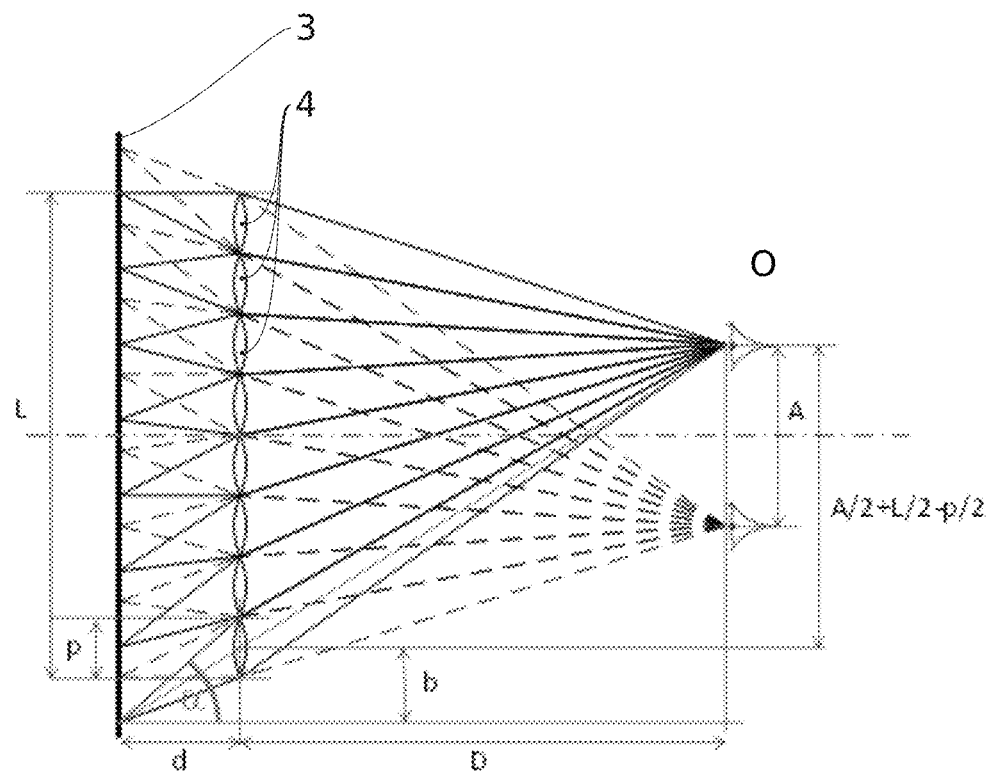
FIG. 28 shows a sizing of a portion of the 3D display system illustrated in FIG. 26.

Such as illustrated in FIG. 28, for a screen of width L and for an observer situated at a distance D having eyes spaced apart from A, the maximum angle α admissible by the microlenses 4 can be approximately determined by:

$$\tan \alpha \approx \frac{A + L/2}{D} \qquad \text{[Math. 4]}$$

That is, for L=195 mm (typical width of a tablet), D=50 cm (typical observation distance of a tablet) and λ=10 cm, α≈21.5°.

The angles α and β are opposite signs. The diffuser 3 is therefore configured so as to have an angular diagram having a maximum diffusion angle of about 40°. Such as shown above, the diffuser 3 according to the invention allows to obtain such an angular diagram.

Figure 29:
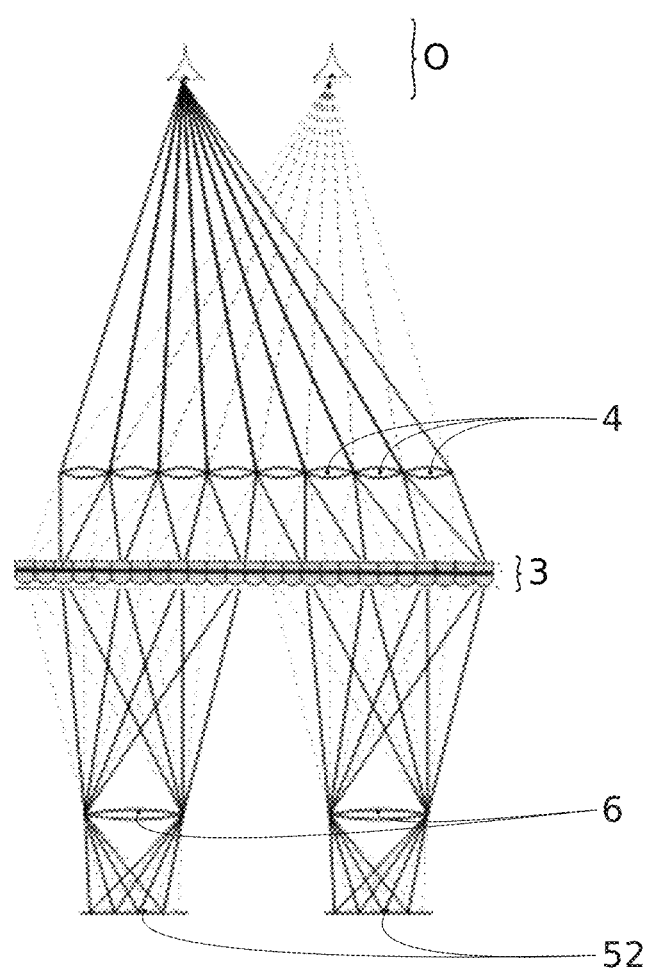
FIG. 29 shows the 3D display system illustrated in FIG. 26 comprising a plurality of diffusers according to an embodiment of the present invention.

A functional and effective 3D display system can therefore be advantageously made by benefiting from the diffuser 3 described in the present invention, such as illustrated in FIG. 29.

The invention is not limited to the embodiments described above and extends to all the embodiments covered by the claims.

The invention claimed is:

1. A diffuser, comprising:
a transmission layer transparent to a light transmitted by a visible light source, and
a diffusion layer for diffusing the light,
wherein the diffusion layer comprises a plurality of metal nanostructures, each having, in projection in a main extension plane, first and second dimensions along respectively first and second orthogonal directions of the main extension plane,
the first and second dimensions are less than 650 nm,
the metal nanostructures are distributed over the transmission layer such that adjacent metal nanostructures have between the adjacent metal nanostructures varied separation distances and
the metal nanostructures are sized so as to have between the adjacent metal nanostructures varied dimensions among the first and the second dimensions.

2. The diffuser of claim 1, where at least some of the adjacent metal nanostructures have separation distances less than 500 nm, and
at least some other adjacent metal nanostructures have separation distances greater than 600 nm.

3. The diffuser of claim 1, wherein, within the diffusion layer, the separation distances between two adjacent metal nanostructures vary up to 200%.

4. The diffuser of claim 1, wherein, for one same metal nanostructure, the first and second dimensions are substantially equal to one another.

5. The diffuser of claim 1, wherein the first and second dimensions of the metal nanostructures are comprised between 100 nm and 500 nm.

6. The diffuser of claim 1, wherein for at least some metal nanostructures, the varied dimensions taken from among the first and the second dimensions are less than 250 nm, and
for at least some other metal nanostructures, the varied dimensions taken from among the first and the second dimensions are greater than 350 nm.

7. The diffuser of claim 1, wherein, within the diffusion layer, the varied dimensions taken from among the first and the second dimensions vary up to 200%.

8. The diffuser of claim 1, wherein, within the diffusion layer, both the first dimension and the second dimension vary.

9. The diffuser of claim 1, further comprising:
a focalisation layer configured to focus the light transmitted on at least one metal nanostructure of the plurality of metal nanostructures.

10. The diffuser of claim 9, wherein the focalisation layer comprises at least one from among a refractive microlens and a Fresnel lens.

11. The diffuser of claim 9, further comprising: a reflection layer situated between the diffusion layer and the focalisation layer within the transmission layer,
wherein the reflection layer has at least one opening facing the at least one metal nanostructure on which the light transmitted is focused.

12. The diffuser of claim 11, wherein the opening has in projection in the main extension plane, a main extension dimension W such that:

$$W \geq \frac{D \cdot d}{H + d}$$

where D is a main extension dimension of the diffuser, d is a distance separating the diffusion layer of the reflection layer, and H is a distance separating the reflection layer of the focalisation layer.

13. The diffuser of claim 1, having in projection in the main extension plane, a main extension dimension D comprised between 5 µm and 30 µm.

14. The diffuser of claim 1, wherein at least one portion of the metal nanostructures are made of at least one metal selected from the group consisting of aluminium, tungsten, copper, silver, and gold.

15. A display system, comprising:
the diffuser of claim 1, and
a point light source,
wherein the diffuser is configured to with the point light source so as to diffuse a light transmitted thereby.

16. The display system of claim 15, further comprising:
a screen comprising a plurality of micro-screen each comprising a plurality of pixels,
a plurality of projection systems associated with the plurality of micro-screens, and
a microlens array associated with the diffuser,
wherein the diffuser is associated with at least one pixel from the pluralities of pixels of the micro-screens.

17. A method for manufacturing a diffuser comprising a diffusion layer for diffusing a light transmitted by a visible light source and a plurality of metal nanostructures, the method comprising:
providing a support made of a material transparent to the light transmitted and having a support face,
forming on the support face, the plurality of metal nanostructures each having, in projection in a main extension plane parallel to the support face, first and second dimensions along respectively the first and second orthogonal directions of the main extension plane, the first and second dimensions being less than 650 nm, the metal nanostructures being distributed on the support such that adjacent metal nanostructures have between the adjacent metal nanostructures, varied separation distances and the metal nanostructures being sized so as to have between the adjacent metal nanostructures, varied dimensions from among the first and the second dimensions.

18. The method of claim 17, further comprising:
depositing on the plurality of metal nanostructures, a material transparent to the light transmitted and surrounding the metal nanostructures, and
forming a composite diffusion layer comprising the material transparent to the light transmitted surrounding the metal nanostructures, so that the composite diffusion layer has a planarized face.

19. The method of claim 18, further comprising:
forming a transmission layer on the planarized face, the transmission layer having a transmission face opposite the planarized face and intended to be facing the light source, and
forming a focalisation layer extending over the transmission face, the focalisation layer being configured to focus the light transmitted on at least one metal nanostructure of the plurality of metal nanostructures.

20. The method of claim 19, wherein the focalisation layer is formed by at least one from among a refractive microlens and a Fresnel lens.

21. The method of claim 19, further comprising:
forming a reflection layer within the transmission layer, between the diffusion layer and the focalisation layer,
wherein the reflection layer has at least one opening facing the at least one metal nanostructure on which the light transmitted is intended to be focused by the focalisation layer.

\* \* \* \* \*